(12) United States Patent
Yokoyama et al.

(10) Patent No.: US 8,659,011 B2
(45) Date of Patent: Feb. 25, 2014

(54) LIGHT-EMITTING ELEMENT, LIGHT-EMITTING DEVICE, AND MANUFACTURING METHOD OF LIGHT-EMITTING ELEMENT

(75) Inventors: Kohei Yokoyama, Kanagawa (JP); Hisao Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/415,450

(22) Filed: Mar. 8, 2012

(65) Prior Publication Data

US 2012/0228592 A1  Sep. 13, 2012

(30) Foreign Application Priority Data

Mar. 11, 2011 (JP) ................. 2011-054822

(51) Int. Cl.
*H01L 29/08* (2006.01)

(52) U.S. Cl.
USPC .......................................... 257/40

(58) Field of Classification Search
USPC ............. 257/40, E51.001–E51.052, 257/E25.008–E25.009; 438/29, 69, 82, 99
See application file for complete search history.

(56) References Cited

U.S. PATENT DOCUMENTS

| | | | |
|---|---|---|---|
| 7,161,184 B2 | 1/2007 | Miyagi et al. | |
| 7,190,335 B2 | 3/2007 | Yamazaki et al. | |
| 7,629,018 B2 | 12/2009 | Yamazaki et al. | |
| 7,834,543 B2 | 11/2010 | Takata | |
| 7,943,938 B2 | 5/2011 | Miyagi et al. | |
| 7,999,463 B2 | 8/2011 | Nomura | |
| 2001/0024083 A1* | 9/2001 | Yamazaki et al. | 313/483 |
| 2003/0060055 A1 | 3/2003 | Kamijima | |
| 2003/0184217 A1 | 10/2003 | Yamazaki et al. | |
| 2005/0082966 A1* | 4/2005 | Yamazaki et al. | 313/498 |
| 2007/0160746 A1* | 7/2007 | Yamazaki et al. | 427/66 |
| 2008/0032585 A1* | 2/2008 | Yamaguchi | 445/49 |
| 2011/0089814 A1 | 4/2011 | Nomura | |
| 2011/0089823 A1 | 4/2011 | Nomura | |
| 2011/0101388 A1 | 5/2011 | Nomura | |
| 2011/0122355 A1 | 5/2011 | Matsumuro et al. | |
| 2011/0140617 A1 | 6/2011 | Nomura | |
| 2011/0210335 A1 | 9/2011 | Miyagi et al. | |

FOREIGN PATENT DOCUMENTS

| | | |
|---|---|---|
| CN | 1449229 A | 10/2003 |
| CN | 101673756 A | 3/2010 |
| CN | 102099848 A | 6/2011 |
| EP | 2 312 560 A1 | 4/2011 |

(Continued)

OTHER PUBLICATIONS

Machine Translation Yamada et al. JP 2005-093397.*

(Continued)

*Primary Examiner* — Shaun Campbell
(74) *Attorney, Agent, or Firm* — Husch Blackwell LLP

(57) ABSTRACT

Provided is a highly reliable light-emitting element in which damage to an EL layer is reduced even when an auxiliary electrode for an upper electrode is provided. Further, a highly reliable light-emitting device in which luminance unevenness is suppressed is provided. The light-emitting element includes a first electrode; an insulating layer over the first electrode; an auxiliary electrode having a projection and a depression on a surface, over the insulating layer; a layer containing a light-emitting organic compound over the first electrode and the auxiliary electrode; and a second electrode over the layer containing the light-emitting organic compound. At least part of the auxiliary electrode is electrically connected to the second electrode.

18 Claims, 13 Drawing Sheets

(56) References Cited

FOREIGN PATENT DOCUMENTS

| JP | 11-97183 | | 4/1999 |
|---|---|---|---|
| JP | 2004-6278 | | 1/2004 |
| JP | 2005-093397 | * | 4/2005 |
| JP | 2005-93397 | | 4/2005 |
| JP | 2005-149800 | | 6/2005 |
| JP | 2005-235491 | | 9/2005 |
| JP | 2009-130132 | | 6/2009 |
| JP | 2010-32643 | | 2/2010 |
| JP | 4664604 B2 | | 4/2011 |
| KR | 10-2011-00523420 | | 5/2011 |
| WO | WO 2010/010847 A1 | | 1/2010 |

OTHER PUBLICATIONS

International Search Report for WO application PCT/JP2012/001002, mailing date Apr. 3, 2012.
Written Opinion of the International Searching Authority for WO application PCT/JP2012/001002, mailing date Apr. 3, 2012.

* cited by examiner

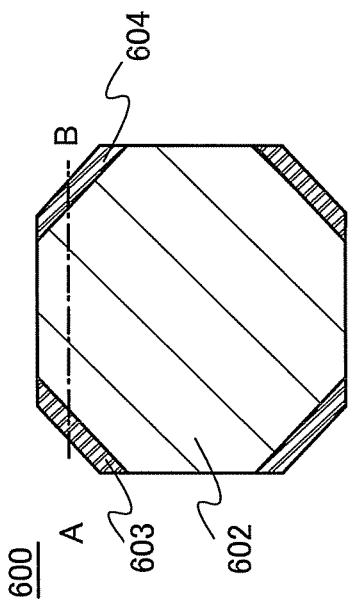
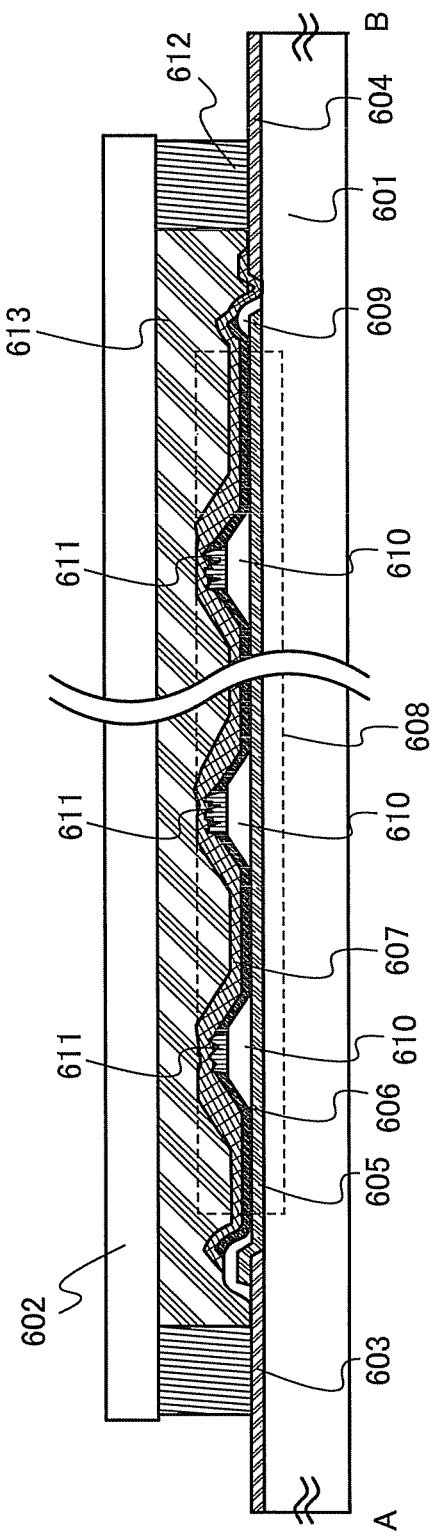
FIG. 10A
FIG. 10B

LIGHT-EMITTING ELEMENT, LIGHT-EMITTING DEVICE, AND MANUFACTURING METHOD OF LIGHT-EMITTING ELEMENT

TECHNICAL FIELD

The present invention relates to a solid-state light-emitting element utilizing electroluminescence (EL). Further, the present invention relates to a light-emitting device using the light-emitting element. Furthermore, the present invention relates to a lighting device using the light-emitting device.

BACKGROUND ART

An organic EL element which is an example of an organic optical device has been actively researched and developed. In the fundamental structure of the organic EL element, a light-emitting organic compound is interposed between a pair of electrodes (an upper electrode and a lower electrode). By applying voltage to this element, light emission from the light-emitting organic compound can be obtained.

The solid-state light-emitting element can be formed into a film; thus, a large-area element can be easily formed. Therefore, the solid-state light-emitting element has a high utility value as a surface light source that can be applied to lighting or the like.

However, as the area of a light-emitting portion in a lighting device or a display device having a large screen increases, a voltage drop due to the resistance of an upper electrode or a lower electrode of a light-emitting element tends to be significant. In the case where a voltage drop in the electrodes is significant, there is a problem in that unevenness in luminance might be seen. In order to solve such a problem, an auxiliary electrode formed using a material having low resistivity needs to be connected to the electrodes.

In Patent Document 1, a structure in which an auxiliary electrode is formed over a transparent electrode is reported. It is much needed to provide an auxiliary electrode for a transparent electrode which is provided on the light extraction side in a light-emitting element. This is because a light-transmitting material used for a transparent electrode has relatively high resistivity. In Patent Document 1, the auxiliary electrode having low resistivity is formed over the transparent electrode to support conductivity of the transparent electrode.

REFERENCE

Patent Document

[Patent Document 1] Japanese Published Patent Application No. H11-97183

DISCLOSURE OF INVENTION

In a bottom-emission light-emitting device in which light is extracted from the element substrate side, such as the light-emitting device disclosed in Patent Document 1, a transparent electrode having high resistivity is provided as a lower electrode; therefore, an electrode for supporting conductivity of the transparent electrode is provided for the lower electrode. Note that in this specification, "transparent" means having a light-transmitting property with respect to visible light and an object which transmits visible light is referred to as a transparent object. In other words, in this specification, even an opaque or colored electrode is referred to as a transparent electrode when having a light-transmitting property.

On the other hand, in a top-emission light-emitting device in which light is emitted from a top surface, a dual-emission light-emitting device, or the like, a transparent electrode having high resistivity needs to be used as an upper electrode. When an electrode having high resistivity is used, a problem in that a voltage drop occurs and thus luminance unevenness occurs is caused in a large-area substrate. In the case where an auxiliary electrode is provided for an upper electrode having high resistivity in order to suppress a voltage drop occurring in the upper electrode, the auxiliary electrode can be provided between an EL layer (a layer containing at least a light-emitting organic compound) and the upper electrode or over the upper electrode, for example. However, when the auxiliary electrode is formed after formation of the EL layer, the EL layer is damaged in manufacturing steps of the auxiliary electrode.

For example, a method employing a photolithography method, which is used for forming a pattern of an auxiliary electrode, is excellent in miniaturization; however, a developer, a remover, or the like enters an EL layer and the EL layer is damaged as a result; thus, performance of an element is decreased.

In an evaporation method or a sputtering method using a metal mask (shadow mask), when an auxiliary electrode is formed either between an EL layer and an upper electrode or over the upper electrode, the metal mask is to be pressed against a surface on which a film is formed. In this case, the EL layer might be damaged by an end portion or an uneven surface of the metal mask in some cases. Further, when a foreign particle over the upper electrode is pressed, a lower electrode and the upper electrode might be short-circuited.

Further, when an auxiliary electrode is provided over an upper electrode, a region overlapping with the auxiliary electrode also emits light. In general, metal having low resistivity, which is used for an auxiliary electrode, does not transmit visible light. In this case, light emitted from the region overlapping with the auxiliary electrode cannot be extracted to the outside, causing a decrease in the power efficiency of the light-emitting element.

When an auxiliary electrode for an upper electrode is provided over a lower electrode or a substrate and an EL layer is patterned so as not to be formed over the auxiliary electrode, a voltage drop of the upper electrode can be suppressed by making contact between the upper electrode and the auxiliary electrode. Note that the EL layer needs to be patterned in this method and the number of manufacturing steps is increased; as a result, a yield becomes low.

The present invention is made in view of the foregoing technical background. Therefore, an object of the present invention is to provide a highly reliable light-emitting element in which an EL layer is not damaged even when an auxiliary electrode is provided for an upper electrode. Further, an object is to provide a highly reliable light-emitting device in which luminance unevenness is suppressed. Furthermore, an object is to provide a method for manufacturing a highly reliable light-emitting element in which an auxiliary electrode is provided for an upper electrode without damage to an EL layer.

In order to achieve the above objects, the auxiliary electrode for the upper electrode is formed before the EL layer is formed. Specifically, an auxiliary electrode having a projection and a depression on a surface is provided below an EL layer, the EL layer is physically divided (also referred to as disconnected or pierced) by the projection and the depression, and the auxiliary electrode and an upper electrode over the EL layer are electrically connected to each other.

Therefore, an embodiment of the present invention is a light-emitting element including a first electrode; an insulating layer over the first electrode; an auxiliary electrode having a projection and a depression, which is provided over the insulating layer; a layer containing a light-emitting organic compound formed over the first electrode and the auxiliary electrode; and a second electrode formed over the layer containing the light-emitting organic compound. At least part of the auxiliary electrode is electrically connected to the second electrode.

An embodiment of the present invention is a light-emitting element including a substrate; a first electrode over the substrate; an auxiliary electrode having a projection and a depression on a surface, which is insulated from the first electrode over the substrate; a layer containing a light-emitting organic compound formed over the first electrode and the auxiliary electrode; and a second electrode formed over the layer containing the light-emitting organic compound. At least part of the auxiliary electrode is electrically connected to the second electrode.

In the light-emitting element according to an embodiment of the present invention, the auxiliary electrode for supporting conductivity of the second electrode can be formed before formation of the layer containing the light-emitting organic compound. Therefore, even when the auxiliary electrode is provided, the light-emitting element can have high reliability, in which damage to the layer containing the light-emitting organic compound is reduced.

Further, in a region overlapping with the auxiliary electrode, the first electrode and the layer containing the light-emitting organic compound are insulated from each other by the insulating layer, so that light emission from a portion in which light is blocked by the auxiliary electrode can be prevented and a light-emitting element in which a decrease in energy efficiency is suppressed can be manufactured.

Further, the light-emitting element according to an embodiment of the present invention may be a top-emission light-emitting element in which the second electrode transmits light emitted from the layer containing the light-emitting organic compound and the light is extracted through the second electrode provided on a side opposite to the substrate. In the case of the top-emission structure, the substrate is not necessarily formed using a fight-transmitting material, and thus, the selection range of the material for, the substrate is expanded. Therefore, a substrate having high thermal conductivity can be used, and thus, thermal dissipation of the light-emitting element can be improved. Moreover, the top-emission structure can be easily devised in a direction to which light is extracted to improve the light-extraction efficiency.

Further, the light-emitting element according to an embodiment of the present invention may include an auxiliary wiring electrically connected to the first electrode between the first electrode and the insulating layer. Therefore, both the auxiliary wiring for supporting conductivity of the first electrode and the auxiliary electrode for supporting conductivity of the second electrode can be manufactured before formation of the layer containing the light-emitting organic compound. Thus, the auxiliary electrode for supporting conductivity of the second electrode and the auxiliary wiring for supporting conductivity of the first electrode can be provided without damage to the layer containing the light-emitting organic compound. With the auxiliary electrode for supporting conductivity of the second electrode and the auxiliary wiring for supporting conductivity of the first electrode, a highly reliable light-emitting element in which a voltage drop is reduced and luminance unevenness is suppressed can be provided. Further, a dual-emission light-emitting element can be provided when both the first electrode and the second electrode of the light-emitting element can transmit light emitted from the layer containing the light-emitting organic compound. In the dual-emission light-emitting element, a region in which light emitted from the layer containing the light-emitting organic compound is blocked by the auxiliary electrode and the auxiliary wiring is insulated, so that supplied electric power can efficiently contribute to light emission in a region where the auxiliary electrode or the auxiliary wiring is not provided.

In the light-emitting element, the projection which is included in the auxiliary electrode and has an inclination of greater than or equal to 40° and less than or equal to 140° with respect to the first electrode is electrically connected to the second electrode. When the inclination of the projection of the auxiliary electrode becomes large, the projection of the auxiliary electrode becomes sharp, and thus, the layer containing the light-emitting organic compound is easily disconnected; accordingly, the auxiliary electrode and the second electrode are easily electrically connected to each other. When the inclination of the projection becomes too large, the second electrode over the EL layer is also disconnected. Therefore, the inclination of the projection of the auxiliary electrode is preferably greater than or equal to 40° and less than or equal to 140°. Under such a condition, the EL layer is disconnected while the second electrode is not.

In the light-emitting element according to an embodiment of the present invention, the auxiliary electrode includes metal particles. The surface of the auxiliary electrode including the metal particles is rough and includes a large number of gaps. Therefore, coverage of the auxiliary electrode with the layer containing the light-emitting organic compound over the auxiliary electrode is poor. Accordingly, the layer containing the light-emitting organic compound is disconnected and the auxiliary electrode and the second electrode are easily electrically connected to each other.

An embodiment of the present invention is a light-emitting device including the light-emitting element.

Further, an embodiment of the present invention is a method for manufacturing a light-emitting element, including a first step of forming a first electrode over a substrate; a second step of forming an insulating layer over the first electrode or the substrate; a third step of forming an auxiliary electrode having a projection and a depression on a surface, over the insulating layer; a fourth step of forming a layer containing a light-emitting organic compound over the first electrode, the insulating layer, and the auxiliary electrode; and a fifth step of forming a second electrode which is electrically connected to the auxiliary electrode over the auxiliary electrode and the layer containing the light-emitting compound.

Further, an embodiment of the present invention is a method for manufacturing a light-emitting element, including a first step of forming a first electrode over a substrate; a second step of forming an auxiliary wiring over the first electrode or the substrate; a third step of forming an insulating layer covering the auxiliary wiring; a fourth step of forming an auxiliary electrode having a projection and a depression on a surface, over the insulating layer; a fifth step of forming a layer containing a light-emitting organic compound over the first electrode, the insulating layer, and the auxiliary electrode; and a sixth step of forming a second electrode which is electrically connected to the auxiliary electrode over the auxiliary electrode and the layer containing the light-emitting compound.

In the above manufacturing method, the auxiliary electrode can be formed before forming the layer containing the light-emitting organic compound, so that a highly reliable light-emitting element can be manufactured without damage to the layer containing the light-emitting organic compound.

The auxiliary electrode is preferably formed by a screen printing method. As compared to a photolithography method, the number of steps can be reduced in a screen printing method, so that cost can be reduced and a light-emitting element can be manufactured with a high yield. Further, in a screen printing method, the shapes of a projection and a depression of a wiring can be changed by changing the shape of a filler or a metal particle in ink; therefore, the auxiliary electrode and the second electrode can be easily electrically connected to each other.

Note that the ordinal numbers such as "first", "second", and "third" in this specification are used for convenience to distinguish elements. Therefore, these ordinal numbers do not limit the number, the arrangement, and the order of steps. In addition, the ordinal numbers in this specification do not denote particular names which specify the present invention.

In addition, in this specification and the like, the term such as "electrode" or "wiring" does not limit a function of a component. For example, an "electrode" is sometimes used as part of a "wiring", and vice versa. Furthermore, the terra "electrode" or "wiring" can include the case where a plurality of "electrodes" or "wirings" is formed in an integrated manner.

Note that in this specification, "surface" means a face which forms an outer surface of a component, such as a top surface or a side surface of a component, and a face which is to be covered in a later step and is not exposed to the outside is also referred to as "surface".

According to an embodiment of the present invention, a highly reliable light-emitting element in which an auxiliary electrode for an upper electrode is provided can be manufactured in a simple process. Further, a highly reliable light-emitting device in which luminance unevenness is suppressed can be provided. Furthermore, a method for manufacturing a highly reliable light-emitting element in which an auxiliary electrode for an upper electrode is provided can be provided.

BRIEF DESCRIPTION OF DRAWINGS

In the accompanying drawings:

FIGS. 10A and 10B illustrate a light-emitting device according to an embodiment of the present invention;

BEST MODE FOR CARRYING OUT THE INVENTION

Figure 1A:
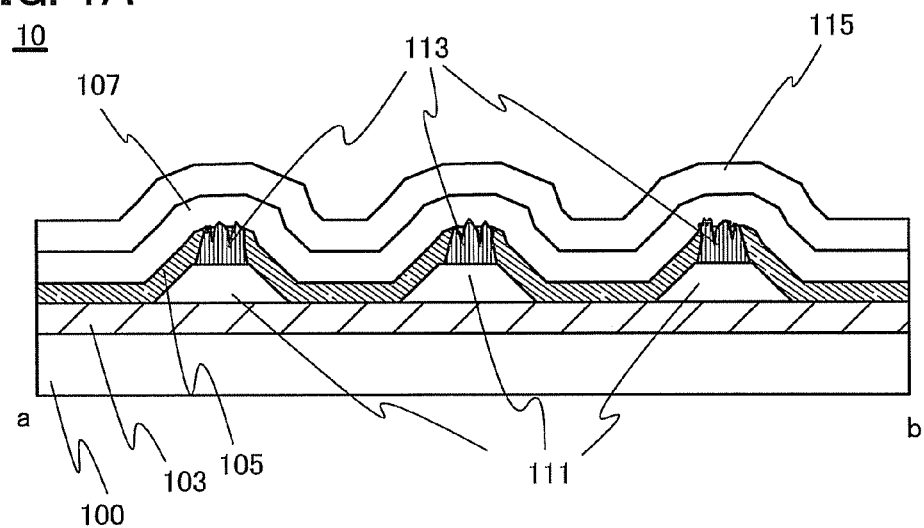
FIGS. 1A and 1B illustrate a light-emitting element according to an embodiment of the present invention.

Hereinafter, embodiments and examples of the present invention will be described in detail with reference to the accompanying drawings. Note that the present invention is not limited to the following description, and it is easily understood by those skilled in the art that modes and details thereof can be modified in various ways without departing from the spirit and the scope of the present invention. Therefore, the present invention should not be limited to the descriptions of the embodiments and the examples below. Note that in structures of the present invention described hereinafter, the same portions or portions having similar functions are denoted by the same reference numerals in different drawings, and description thereof is not repeated.

Note that in each drawing described in this specification, the size, the layer thickness, or the region of each component is exaggerated for clarity in some cases. Therefore, embodiments and examples of the present invention are not limited to such scales.

Embodiment 1

In this embodiment, a light-emitting element according to an embodiment of the present invention will be described with reference to FIGS. 1A and 1B. FIG. 1B is a top view of a light-emitting element of this embodiment and FIG. 1A shows a cross section taken along line a-b in FIG. 1B.

Figure 1B:
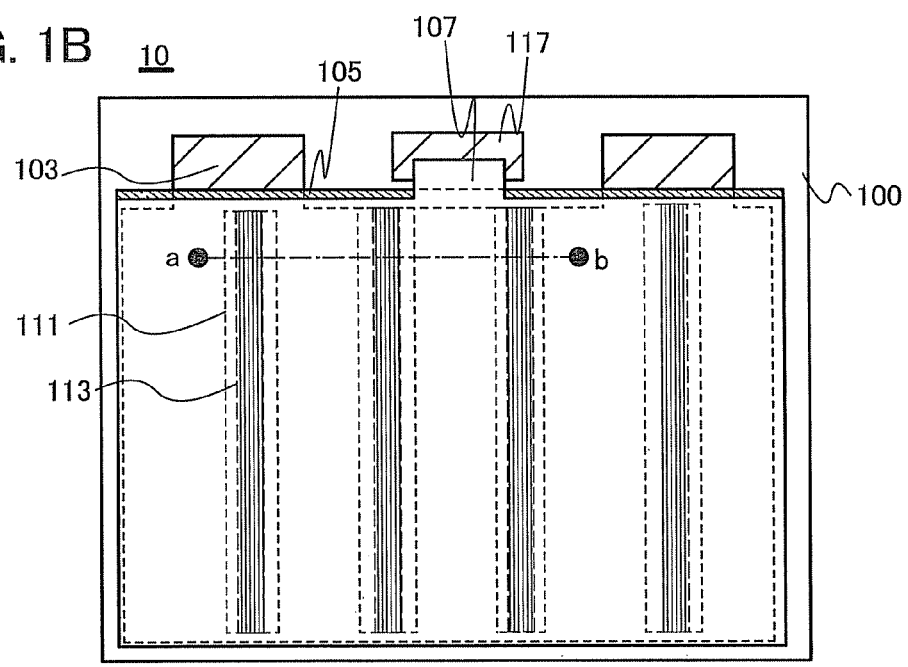

As illustrated in FIG. 1A, a light-emitting element 10 of this embodiment includes a first electrode 103 over a substrate 100; an island-shaped insulating layer 111 over the first electrode 103; an auxiliary electrode 113 having a projection and a depression on a surface, over the insulating layer 111; an EL layer 105 over the first electrode 103, the insulating layer 111, and the auxiliary electrode 113; and a second electrode 107 over the EL layer 105. A sealing film 115 may be provided over the second electrode 107.

As illustrated in FIG. 1B, the second electrode 107 is electrically connected to a wiring 117. Although not illustrated, the wiring 117 is connected to an external power source and voltage is applied to the second electrode 107 through the wiring 117.

The light-emitting element 10 has a top-emission structure in which light is extracted from a surface opposite to a surface in contact with the substrate 100. Therefore, the second electrode 107 provided on a side from which light is extracted is a transparent electrode which transmits visible light.

In general, a material having a light-transmitting property with respect to visible light, which is used for the second electrode 107 on the side from which light is extracted, has high resistivity. Therefore, it is difficult to keep a potential constant in part of the second electrode 107 and luminance unevenness might occur. Thus, as an electrode for supporting conductivity of the second electrode 107 having high resistivity, the auxiliary electrode 113 is provided.

The auxiliary electrode 113 is fainted using a metal having resistivity lower than at least the resistivity of the material used for the second electrode 107. Further, the auxiliary electrode 113 has a projection and a depression on the surface. The EL layer 105 is thinner than the auxiliary electrode 113; thus, the EL layer 105 is disconnected because of the projection and the depression of the auxiliary electrode 113. When the EL layer 105 is disconnected, the projection of the auxiliary electrode 113 comes out of the EL layer 105. As a result, the second electrode 107 provided over the EL layer 105 and the projection of the auxiliary electrode 113 are electrically connected to each other. The conductivity of the second electrode 107 is supported by the auxiliary electrode 113 having low resistivity; thus, a voltage drop of a specific portion of the second electrode 107 is prevented and luminance unevenness of the light-emitting element 10 is reduced.

Here, the projection and the depression of the auxiliary electrode are described in detail. The auxiliary electrode includes a plurality of projections with a variety of sizes, and some of the plurality of projections are electrically connected to the second electrode. The shape of the projection which is easily electrically connected to the second electrode is described. Note that in this specification, "inclination of the projection of the auxiliary electrode" means an angle limited between a side surface of the projection of the auxiliary electrode 113 and a flat surface formed by the substrate or the first electrode 103.

The inclinations of projections of the auxiliary electrode 113 are not necessarily the same, and one auxiliary electrode 113 can include projections with a variety of inclinations. It is particularly preferable that the auxiliary electrode 113 include a projection with an inclination of greater than or equal to 40° and less than or equal to 140° with respect to the first electrode 103. As the angle between the side surface of the projection and the flat surface (a horizontal plane such as a surface of a substrate) formed by the first electrode 103 becomes steeper, the EL layer 105 over the projection and the depression becomes thinner than the auxiliary electrode 113; accordingly, the EL layer 105 is easily disconnected. Further, the second electrode 107 over the EL layer 105 is also disconnected when the inclination of the projection is too large. Therefore, it is preferable that the inclination of the projection of the auxiliary electrode 113 be greater than or equal to 40° and less than or equal to 140° so that the EL layer 105 is disconnected but the second electrode 107 is not. It is more preferable that the inclination of the projection of the auxiliary electrode 113 be greater than or equal to 40° and less than or equal to 90°. When the inclination of the projection of the auxiliary electrode 113 is less than or equal to 90°, it is easy to form the second electrode 107 without disconnection at the timing of formation even in the case where a highly anisotropic method is used.

It is preferable that the projection have a needle-like structure which becomes sharper toward a tip portion. With such a structure, disconnection easily occurs at the tip portion of the projection. Note that the projection included in the auxiliary electrode 113 is not limited to a needle-like structure. The projection of auxiliary electrode 113 may have a structure of a pyramid with a polygonal base, a parallelepiped structure, a cubic structure, or the like, or a structure including a group of such a structure as long as the EL layer 105 is disconnected by the projection and the depression of the auxiliary electrode 113.

The auxiliary electrode 113 preferably includes a plurality of projections and depressions. When the plurality of projections and depressions is in a region where the auxiliary electrode 113 is formed, the inclination of a side surface of each of the projections becomes large and coverage with the EL layer 105 becomes poor, leading to disconnection of the EL layer 105.

It is preferable that a difference in height between the highest point and the lowest point of the projection and the depression be greater than or equal to 0.5 µm and less than or equal to 10 µm. In the case where the number of the projections and that of the depressions are equal in the auxiliary electrode 113 and the width of the depression and that of the projection are equal, the EL layer 105 is disconnected more easily as the difference in height between the projection and the depression is larger.

In the light-emitting element 10, the auxiliary electrode 113 can be formed before the EL layer 105 is formed. Therefore, the EL layer 105 is not damaged in the steps of manufacturing the auxiliary electrode 113. Thus, a highly reliable light-emitting element in which the auxiliary electrode 113 is provided for an upper electrode (the second electrode 107) can be manufactured.

A conductive material having low resistivity, which is used for the auxiliary electrode 113, does not transmit light in many cases. For example, in the case where an auxiliary electrode is provided over the second electrode 107, light emitted from a region overlapping with the auxiliary electrode is blocked by the auxiliary electrode and it is difficult to extract the light. In the light-emitting element 10, the region overlapping with the auxiliary electrode 113 is insulated by the insulating layer 111 to be a non-light-emitting region; thus, a region in which light is blocked by the auxiliary electrode 113 can be prevented from emitting light, and a decrease in energy efficiency can be suppressed.

Next, a material which can be used for the light-emitting element of this embodiment will be described.

As a material of the substrate 100, a material which functions as a support of a light-emitting element, such as glass, an organic resin, a metal, or a semiconductor, can be used. Since the light-emitting element 10 has a top-emission structure in which light is extracted to the outside from a surface opposite to the surface in contact with the substrate, the substrate does not necessarily transmit visible light. Therefore, there is no limitation on the material of the substrate 100, and an inexpensive substrate can be used. For example, a flexible substrate such as a plastic substrate can be used as the substrate 100.

In the case where an organic resin is used for the substrate 100, for example, any of the following can be used as the organic resin: polyester resins such as polyethylene terephthalate (PET) and polyethylene naphthalate (PEN), a polyacrylonitrile resin, a polyimide resin, a polymethylmethacrylate resin, a polycarbonate (PC) resin, a polyethersulfone (PES) resin, a polyamide resin, cycloolefin resin, a polystyrene resin, a polyamide imide resin, a polyvinylchloride resin, and the like. Further, a substrate in which a glass fiber is impregnated with an organic resin or a substrate in which an inorganic filler is mixed with an organic resin can also be used.

Alternatively, a substrate having high thermal conductivity, such as a metal substrate, can be used. In the case of a large lighting device including an EL element, heat from the EL element becomes a problem in some cases; therefore, heat dissipation can be increased with the use of such a substrate having high thermal conductivity, which is preferable. For example, when a substrate of aluminum oxide, duralumin, or the like is used other than a stainless steel substrate, light weight and high thermal dissipation can be achieved. When a stack of aluminum and aluminum oxide, a stack of duralumin and aluminum oxide, a stack of duralumin and magnesium oxide, or the like is used, the surface of the substrate can have an insulating property, which is preferable.

The first electrode 103 functions as a reflective electrode; therefore, the first electrode 103 is formed using a reflective material. As the reflective material, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. The first electrode 103 may have unevenness to increase reflectance.

The insulating layer 111 is not particularly limited as long as it has an insulating property. For example, as an inorganic material, silicon oxide, silicon nitride, silicon oxynitride, aluminum oxide, lithium fluoride, calcium fluoride, magnesium fluoride, or the like can be used. As an organic material, an organic resin containing polyimide, polyamide, polyimide amide, benzocyclobutene or the like, an epoxy resin, a resist, or the like can be used.

The auxiliary electrode 113 is an electrode for supporting conductivity of the second electrode 107 having high resistivity. Therefore, the auxiliary electrode 113 is formed using a material having resistivity lower than at least that of the second electrode 107 to be described later. The auxiliary electrode 113 can be formed of a single layer or a stacked layer using a material such as silver, copper, titanium, tantalum, tungsten, molybdenum, chromium, neodymium, scandium, or nickel, or an alloy material containing any of these materials as its main component. Aluminum can also be used as the material of the auxiliary electrode 113; however, in that case, aluminum might be corroded when aluminum is provided to be in direct contact with indium tin oxide (ITO) or the like which is used for the transparent electrode. Therefore, it is preferable that the auxiliary electrode 113 have a stacked-layer structure and that aluminum be used for a layer which is not in contact with indium tin oxide or the like.

When a silver paste or the like is used for the material of the auxiliary electrode 113, metal included in the material forms particles and gathers to form the auxiliary electrode 113. Therefore, the surface of the auxiliary electrode 113 is rough and includes a large number of gaps, and thus, it is difficult for the EL layer 105 to completely cover the auxiliary electrode 113; accordingly, the second electrode 107 and the auxiliary electrode 113 are easily connected to each other.

The EL layer 105 includes at least a layer containing a light-emitting organic compound. Note that the EL layer 105 will be described in detail in a later embodiment.

The second electrode 107 is provided on the side from which the light is emitted, so that the second electrode 107 needs to transmit visible light. As a light-transmitting material, indium oxide, indium tin oxide, indium zinc oxide, zinc oxide, zinc oxide to which gallium is added, graphene, or the like can be used.

Further, the sealing film 115 is provided over the second electrode 107. The EL layer 105 is sensitive to water. When the sealing film 115 having a barrier property is provided, reliability of the light-emitting element 10 can be increased. As the sealing film, a silicon oxide film, a silicon nitride film, a silicon oxynitride film, a silicon nitride oxide film, an aluminum oxide film, or the like can be used.

A planarization film may be provided over the second electrode 107 or the sealing film 115. The planarization film can be formed using an inorganic insulating material or an organic insulating material. A heat-resistant organic insulating material such as an acrylic resin, polyimide, a benzocyclobutene-based resin, polyamide, or an epoxy resin is preferably used for a planarization insulating film. Other than such organic insulating materials, it is possible to use a low-dielectric constant material (a low-k material), a siloxane-based resin, phosphosilicate glass (PSG), borophosphosilicate glass (BPSG), or the like. Note that the planarization film may be formed by stacking a plurality of insulating films formed using these materials. Note that the sealing film 115 may have a function of a planarization film.

Modification Example

In the light-emitting element described in this embodiment, the island-shaped insulating layer 111 and the auxiliary electrode 113 having the projection and the depression on the surface are not necessarily provided over the first electrode 103. For example, as in a light-emitting element 11 illustrated in FIGS. 4A and 4B, the auxiliary electrode 113 may be provided over an insulating layer 112 in contact with the substrate. FIG. 4B is a top view of the light-emitting element 11 in which the insulating layer 112 is directly formed on the substrate and the auxiliary electrode 113 is provided thereover, and FIG. 4A illustrates a cross section taken along line a-b in FIG. 4B.

Figure 4A:
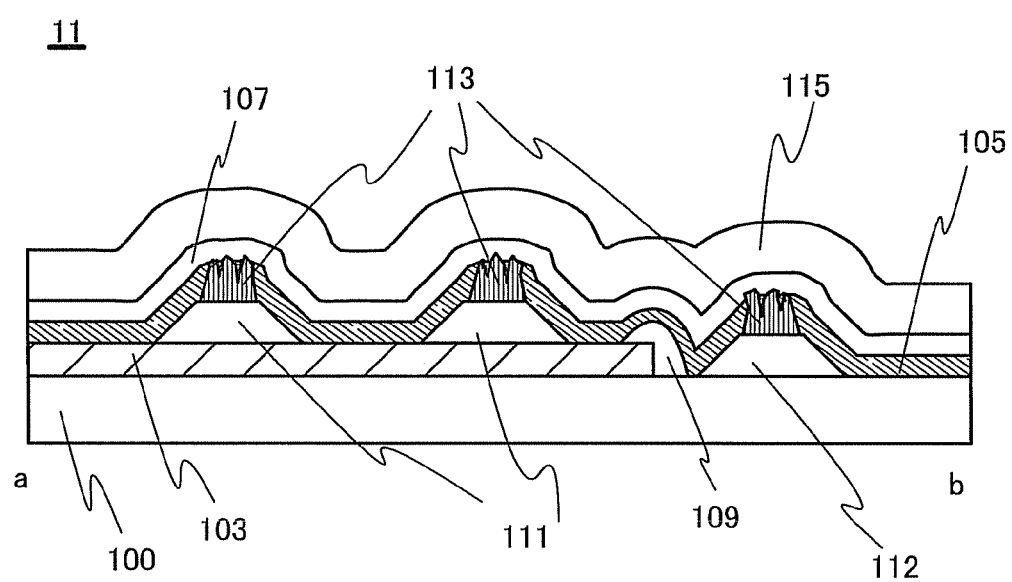
FIGS. 4A and 4B illustrate a light-emitting element according to an embodiment of the present invention.
Figure 4B:
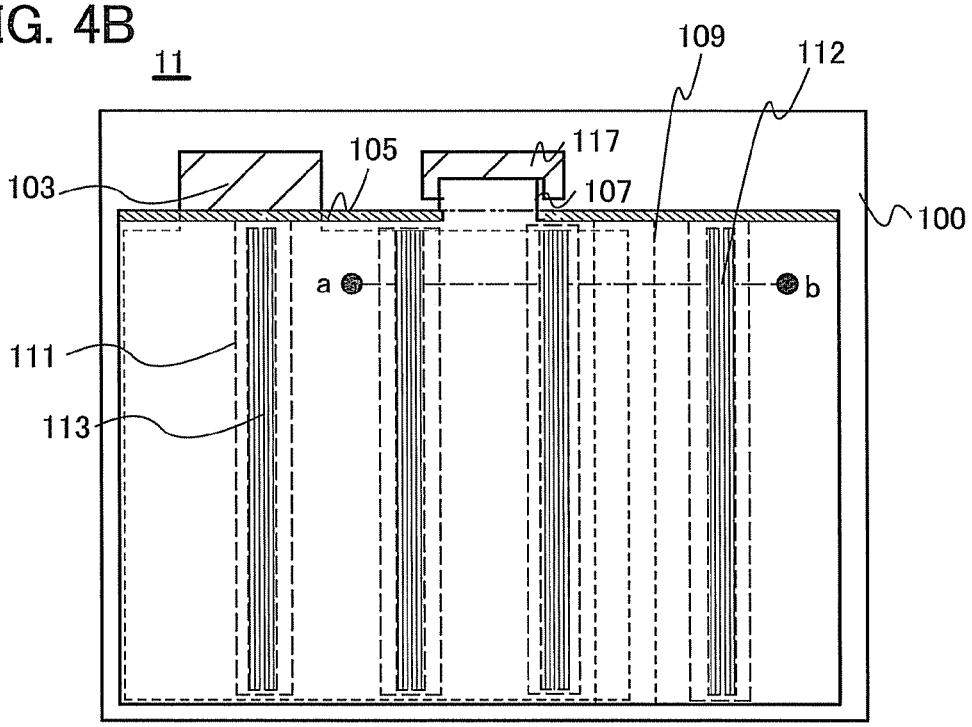

The light-emitting element 11 illustrated in FIG. 4A includes the insulating layer 112 over the substrate 100 and the auxiliary electrode 113 having the projection and the depression on the surface over the insulating layer 112. The EL layer 105 over the auxiliary electrode 113 is disconnected by the projection and the depression, and the projection of the auxiliary electrode 113 and the second electrode 107 are electrically connected to each other. Further, as long as insulation of the auxiliary electrode 113 from the substrate 100 and the first electrode 103 is ensured, the auxiliary electrode 113 having the projection and the depression may be formed directly on the substrate 100 without the insulating layer 112.

Note that when the insulating layer 112 is formed directly on the substrate and the auxiliary electrode 113 is provided thereover, it is preferable that a partition 109 be provided at an end portion of the first electrode 103 as illustrated in FIG. 4A. This is for preventing the EL layer 105 from being disconnected between the end portion of the first electrode 103 and the insulating layer 112 over the substrate and for ensuring insulation of the auxiliary electrode 113 from the first electrode 103. Note that it is preferable that the partition 109 be manufactured in the same process as the insulating layer 112 because the number of steps can be reduced.

Further, the auxiliary electrode 113 provided over the substrate can also be used as a connection wiring with an external power source. For example, the connection electrode with an external power source can be manufactured in the same manufacturing step as the auxiliary electrode 113, which is preferable. A connection electrode can be manufactured in the same step as the auxiliary electrode 113 in the case of using a large-area substrate or the like.

The light-emitting element of this embodiment may have a bottom-emission structure. As in a light-emitting element 12 illustrated in FIG. 6A, a light-transmitting transparent electrode may be used as the first electrode 103 and a light-blocking electrode serving as a reflective electrode may be used as the second electrode 107. In general, an electrode used as a reflective electrode has low resistivity. However, in the case where the second electrode 107 has a large area, or the like, in some cases, a potential held in a specific portion of the second electrode 107 changes, leading to a voltage drop.

Figure 6A:
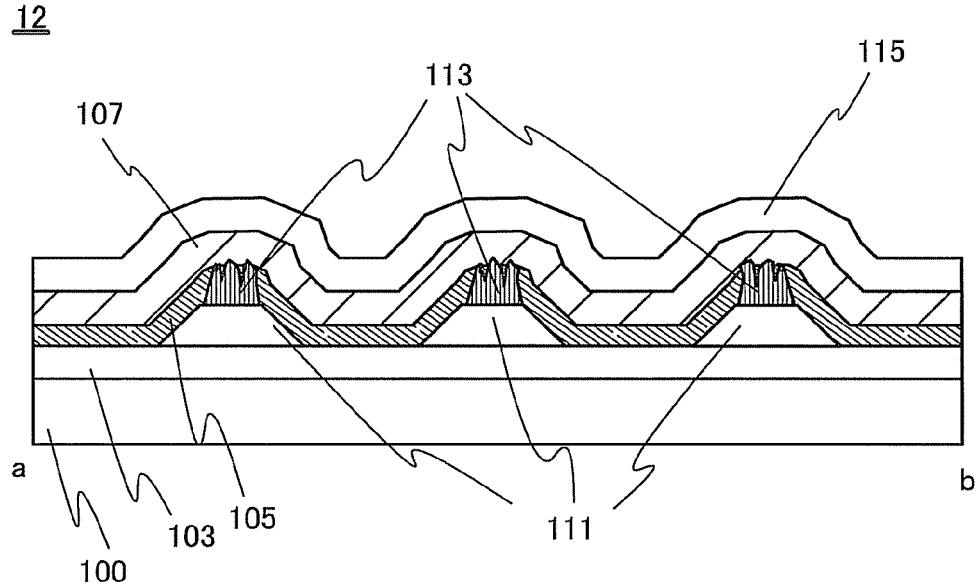
FIGS. 6A and 6B illustrate a light-emitting element according to an embodiment of the present invention.
Figure 6B:
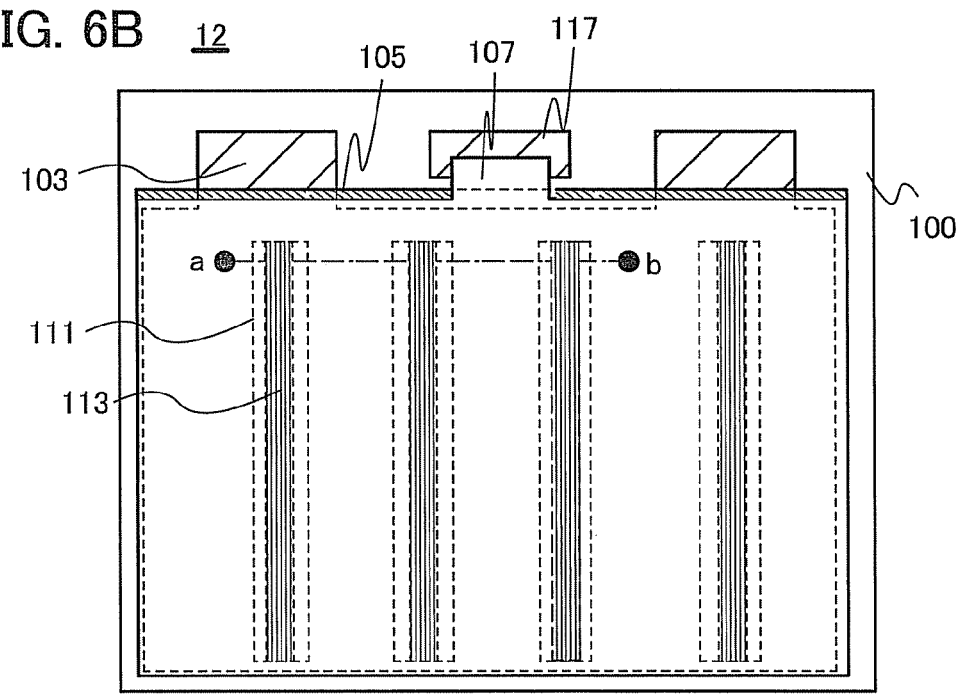

In this case, when the auxiliary electrode 113 is provided as in the light-emitting element 12 illustrated in FIGS. 6A and 6B, a voltage drop in the specific portion of the second electrode 107 can be suppressed and luminance unevenness can be reduced; thus, a highly reliable light-emitting element can be provided.

Figure 7:
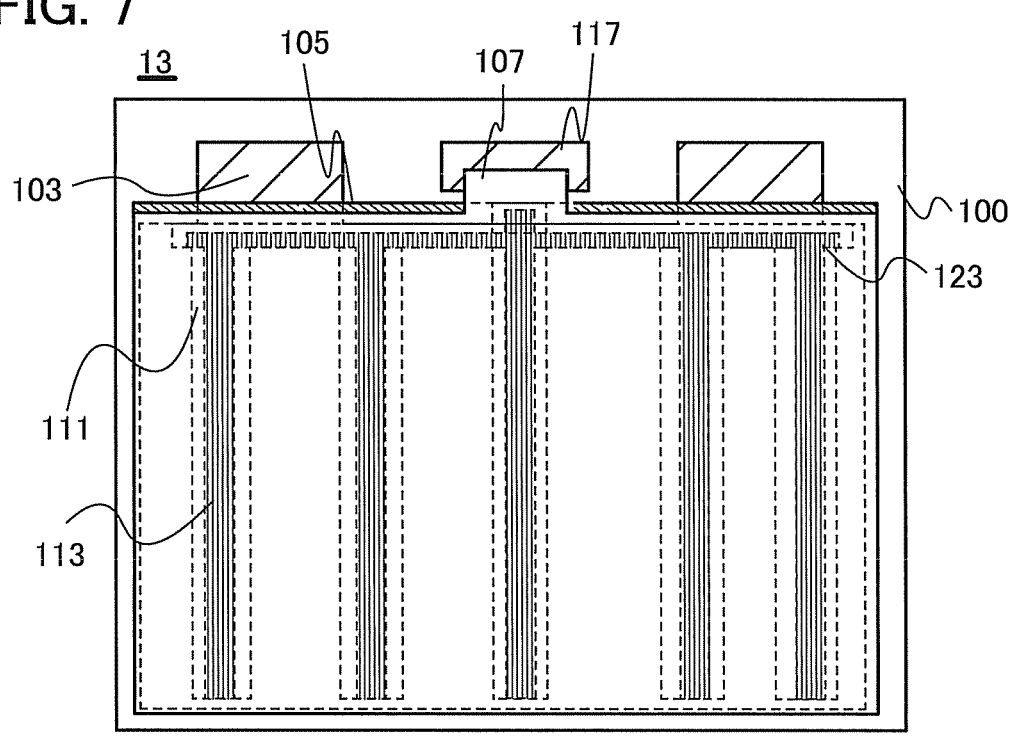
FIG. 7 illustrates a light-emitting element according to an embodiment of the present invention.

Further, the light-emitting element of this embodiment can have a structure in which one auxiliary electrode is provided so as to be perpendicular to another auxiliary electrode when seen from the above, as in a light-emitting element 13 illustrated in FIG. 7. Auxiliary electrodes can be freely provided so that a voltage drop of the second electrode can be reduced more. Further, the sizes of the auxiliary electrodes may differ depending on the positions where the auxiliary electrodes are provided. A voltage drop particularly easily occurs in a portion distant from a connection portion with an external power source; therefore, as illustrated in FIG. 7, when an auxiliary electrode 123 is provided in a lateral direction in a portion close to the wiring 117 which is connected to the external power source and another auxiliary electrode is provided for the auxiliary electrode 123 in a longitudinal direction away from the external power source, a voltage drop can be suppressed. Note that not only one wiring but also a plurality of wirings to be connected to the external power source can be provided. When an auxiliary electrode which is electrically connected to each wiring is provided, a voltage drop can be prevented.

Figure 8A:
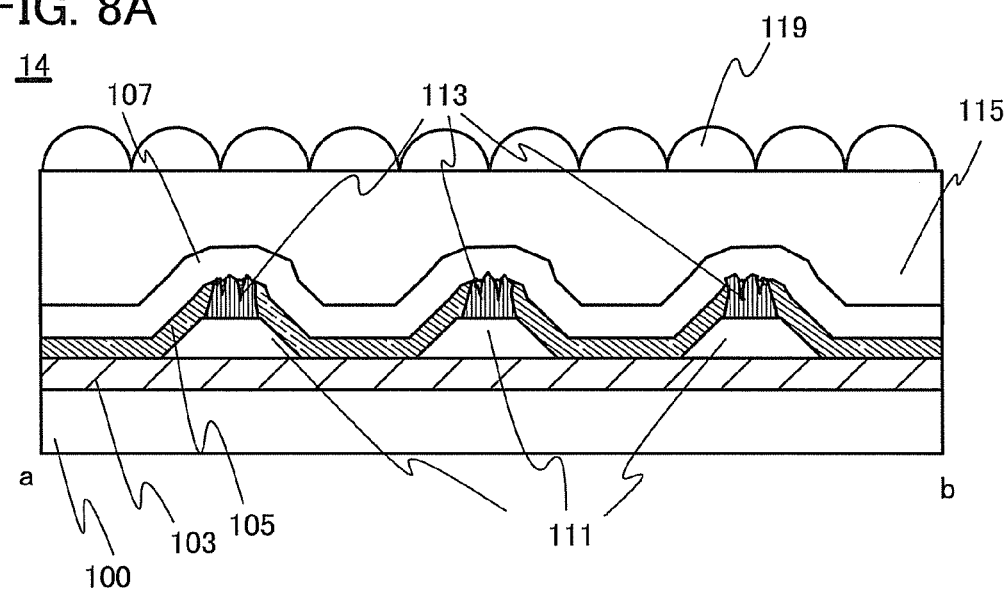
FIGS. 8A and 8B illustrate a light-emitting element according to an embodiment of the present invention.
Figure 8B:
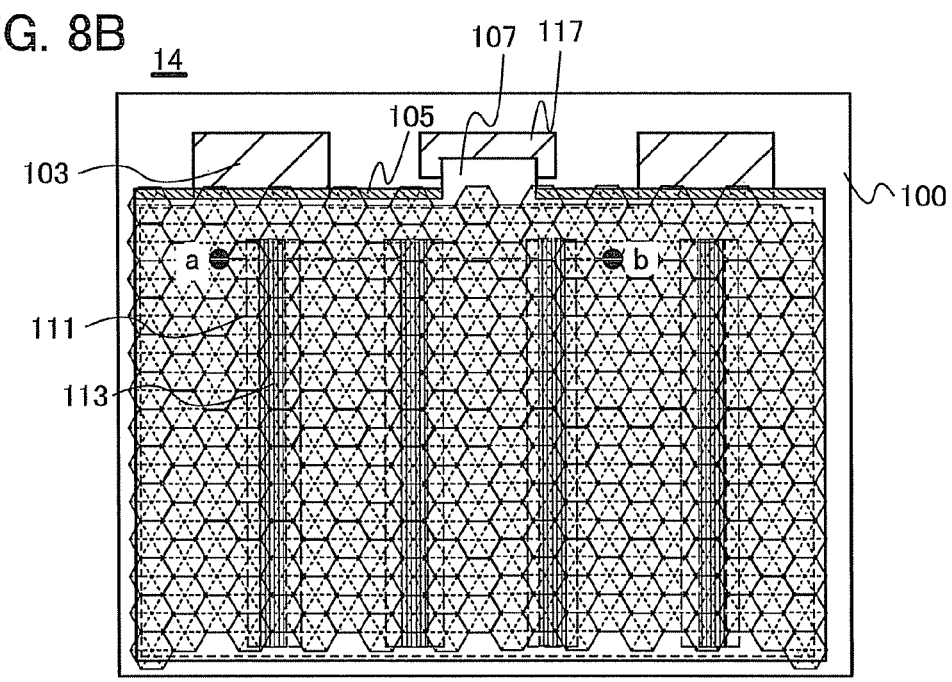

Further, in the light-emitting element of this embodiment, an optical element for improving the light-extraction efficiency may be provided over the upper electrode. In a light-emitting element 14 illustrated in FIGS. 8A and 8B, a microlens array 119 is provided over the sealing film 115. FIG. 8B is a top view of the light-emitting element 14 and FIG. 8A is a cross-sectional view taken along line a-b in FIG. 8B. In the light-emitting element 14, an optical element such as a microlens array can be provided on the sealing side and there is no need to provide a light-emitting element directly for the microlens array; accordingly, the selection range of a material for the microlens array can be expanded.

It is preferable that as an optical element such as a microlens array, projections be provided in a close-packed arrangement over the light-emitting element as illustrated in FIG. 8B. The projections as the optical element provided over the light-emitting element can have a conical pyramidal shape or a shape of a pyramid with a polygonal base, such as a square pyramidal shape or a hexagonal pyramidal shape, other than a hemispherical shape.

In the light-emitting element described in this embodiment, an auxiliary electrode can be formed before an EL layer is formed. Therefore, even when an auxiliary electrode is provided for an upper electrode, damage to the EL layer can be reduced and thus a highly reliable light-emitting element can be provided.

Further, since a region for which an auxiliary electrode is provided in the light-emitting element described in this embodiment does not emit light, light which cannot be extracted to the outside can be prevented from being emitted; thus, a light-emitting element in which a reduction in energy efficiency is suppressed can be provided.

This embodiment can be combined with any of the other embodiments disclosed in this specification as appropriate.

Embodiment 2

In this embodiment, among light-emitting elements according to embodiments of the present invention, a dual-emission light-emitting element will be described with reference to FIGS. 5A and 5B. Note that as for a structure similar to the structure of any of the top-emission light-emitting elements in Embodiment 1, and the same portion or a portion having the same function as those of any of the top-emission light-emitting elements in Embodiment 1, description thereof will be omitted in this embodiment.

Figure 5A:
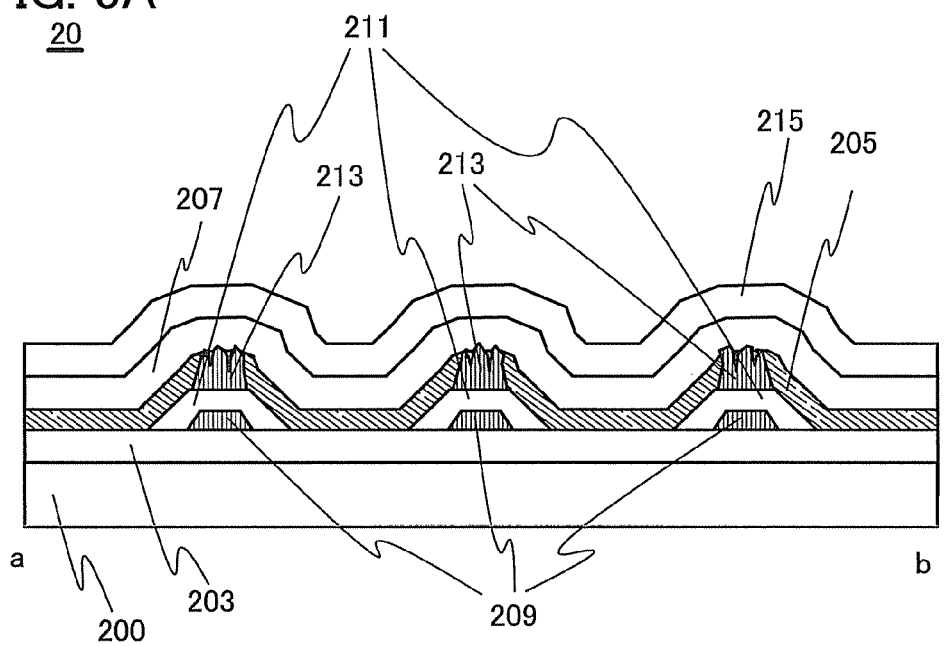
FIGS. 5A and 5B illustrate a light-emitting element according to an embodiment of the present invention.
Figure 5B:
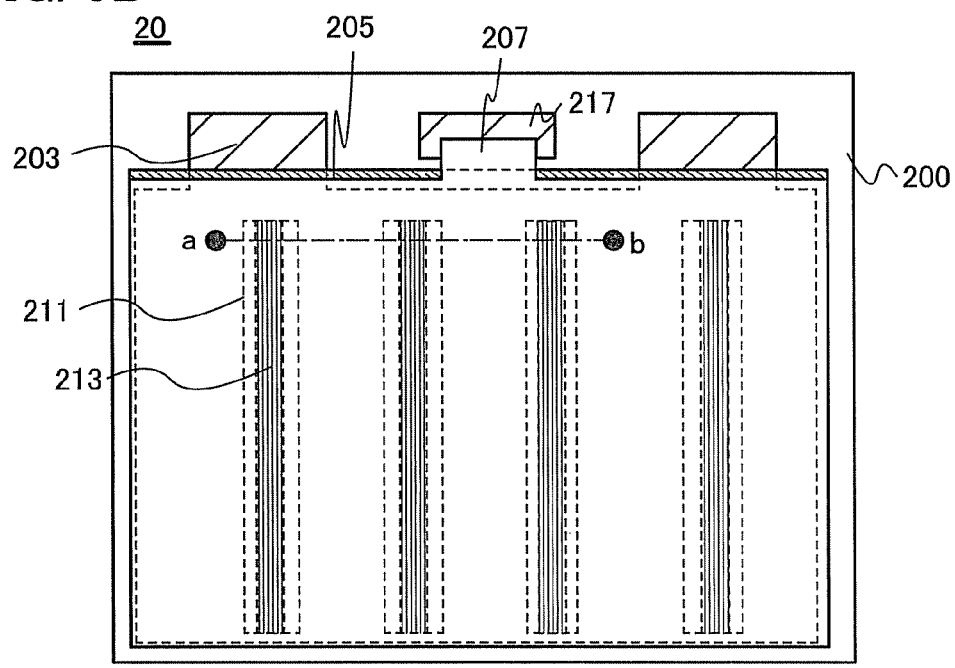

A dual-emission light-emitting element 20 illustrated in FIGS. 5A and 5B includes a first electrode 203 over a substrate 200; an island-shaped auxiliary wiring 209 over the first electrode 203; an island-shaped insulating layer 211 covering the auxiliary wiring 209; an auxiliary electrode 213 having a projection and a depression on a surface over the insulating layer 211; an EL layer 205 over the first electrode 203, the insulating layer 211, and the auxiliary electrode 213; a second electrode 207 over the EL layer 205; and a sealing film 215 over the second electrode 207.

Since the light-emitting element 20 is a dual-emission light-emitting element, the substrate 200, the first electrode 203, and the second electrode 207 each transmit visible light.

As a transparent substrate which can be used as the substrate 200, in addition to a glass substrate, a quartz substrate, and a ceramic substrate, a plastic substrate with heat resistance which can withstand a process temperature in this manufacturing process can be used.

Any of the light-transmitting conductive materials used for the second electrode of the light-emitting element described in Embodiment 1 can be used for the first electrode 203 and the second electrode 207. In general, a material used for a transparent electrode which transmits visible light has high resistivity. Therefore, in the light-emitting element 20, the auxiliary wiring 209 and the auxiliary electrode 213 for supporting conductivity of the transparent electrodes are provided for the first electrode 203 and the second electrode 207, respectively.

The auxiliary wiring 209 is provided as an electrode for supporting conductivity of the first electrode 203. The auxiliary wiring 209 is formed using a material having resistivity lower than at least that of the first electrode 203. The auxiliary wiring 209 is provided over the first electrode 203. One surface of the auxiliary wiring 209 is electrically connected to the first electrode 203, while the other surfaces of the auxiliary wiring 209 are covered with the insulating layer 211. The auxiliary wiring 209 preferably has a shape with which coverage with the insulating layer 211 and the EL layer 205 can be increased so that insulation of the auxiliary wiring 209 from the second electrode 207 is ensured. For example, the auxiliary wiring 209 can have an island shape as illustrated in FIG. 5A. In order to increase coverage at an end portion of the island-shaped auxiliary wiring 209, a side surface of the auxiliary wiring 209 preferably has a gentle slope. For example, the auxiliary wiring 209 preferably has a tapered shape in which the angle formed between the first electrode 203 and a side surface of the auxiliary wiring 209 is less than or equal to 60°, preferably less than or equal to 40°.

The auxiliary electrode 213 for supporting conductivity of the second electrode 207 is provided over the insulating layer 211. The auxiliary electrode 213 is formed using a metal having resistivity lower than at least that of the second electrode 207. Further, the auxiliary electrode 213 has the projection and the depression on the surface. The EL layer 205 over the auxiliary electrode 213 is disconnected by the projection and the depression of the auxiliary electrode 213. When the EL layer 205 is disconnected, the projection of the auxiliary electrode 213 comes out of the EL layer 205, and the auxiliary electrode 213 and the second electrode 207 are electrically connected to each other. The auxiliary electrode 213 having low resistivity prevents luminance unevenness due to a voltage drop of the second electrode 207.

A conductive material having low resistivity, which is used for each of the auxiliary wiring 209 and the auxiliary electrode 213, does not transmit light in general. Therefore, light emitted from a region overlapping with a region provided with the auxiliary wiring or the auxiliary electrode is blocked and it is difficult to extract light to the outside. In a region overlapping with the auxiliary wiring 209 or the auxiliary electrode 213 in the light-emitting element 20, the first electrode 203 and the EL layer 205 are insulated from each other by the insulating layer 211, so that light is not emitted from the region. Accordingly, light emission in the region in which light is blocked can be prevented and a decrease in energy efficiency can be prevented.

In the light-emitting element described in this embodiment, an auxiliary electrode can be formed before an EL layer is formed. Therefore, damage to the EL layer caused in formation of the auxiliary electrode can be reduced, and thus, a highly reliable light-emitting element in which an auxiliary electrode is provided for an upper electrode can be manufactured.

This embodiment can be combined with any of the other embodiments as appropriate.

Embodiment 3

In this embodiment, an example of a method for manufacturing the light-emitting element described in Embodiment 1 will be described with reference to FIGS. 2A to 2D and FIGS. 3A to 3C. According to the manufacturing method described in this embodiment, damage to an EL layer can be reduced even when an auxiliary electrode is provided for an upper electrode, so that a highly reliable light-emitting element can be manufactured.

Figure 2A:
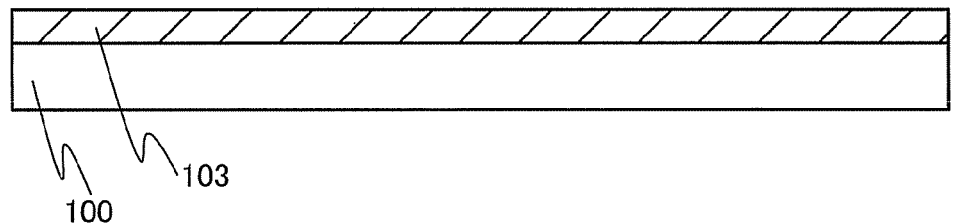
FIGS. 2A to 2D illustrate a method for manufacturing a light-emitting element according to an embodiment of the present invention.
Figure 2B:
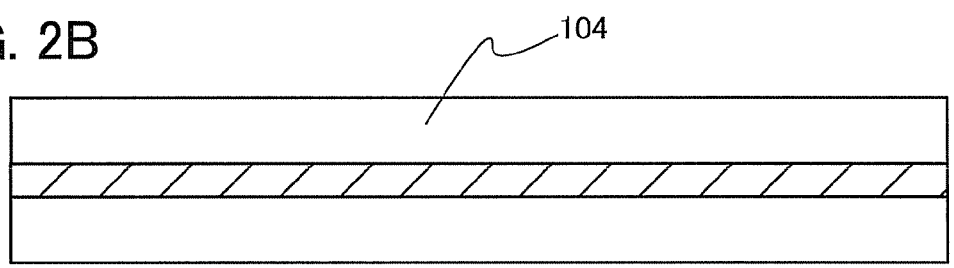
Figure 2C:
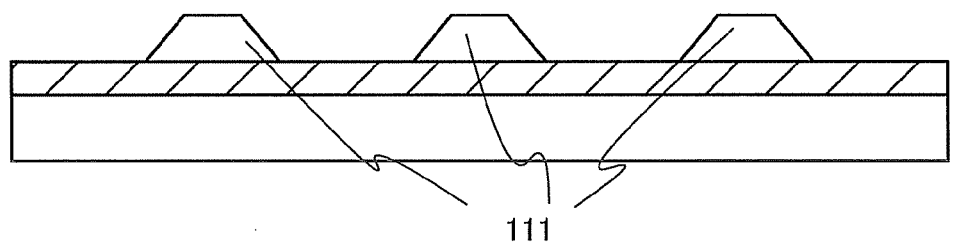

First, as illustrated in FIG. 2A, a first step of forming a conductive layer to be the first electrode 103 over the substrate 100 is performed. The first electrode 103 can be formed using any of the materials described in Embodiment 1 by a film formation method such as a sputtering method or an evaporation method. After that, an unnecessary portion of the conductive layer is removed by a processing method such as a photolithography method, so that the first electrode 103 is formed.

Although not illustrated, a base film may be formed over the substrate 100 before the first electrode 103 is formed. An insulating layer serving as a barrier film can be used as the base film, and can be formed by a film formation method such as a CVD method or a sputtering method. As the base film, an inorganic insulating film can be formed by a sputtering method, for example. For example, a silicon nitride film, an aluminum oxide film, a silicon oxide film, or the like may be formed. The sealing film or the base film which is provided on the side opposite to the direction in which light is emitted may be a stack of a metal film and the above inorganic insulating film.

When an organic resin is used for the substrate, a glass layer with a thickness of greater than or equal to 25 μm and less than or equal to 100 μm may be used as a base film. The thickness of the glass layer is particularly preferably greater than or equal to 45 μm and less than or equal to 80 μm. By combining an organic resin substrate and a glass layer, moisture, an impurity, or the like can be prevented from entering an organic compound or a metal material included in the light-emitting element from the outside of the light-emitting unit, and the weight of the light-emitting unit can be reduced.

Further, a layer having a projection and a depression may be formed over the substrate 100 before the first electrode 103 is formed. When the projection and the depression are formed, a function of a reflective electrode can be enhanced and the light-extraction efficiency can be improved. There is no limitation on a material, a refractive index, a property of transmitting visible light, and the like of the layer having the projection and the depression. Heat treatment may be performed, and there is also no limitation on a method for forming the projection and the depression. For example, a nanoimprint method or a photolithography method can be used.

Alternatively, after a wiring such as the wiring 117 illustrated in FIG. 1B is formed over the substrate 100 and then a planarization insulating film having an opening in a region corresponding to the wiring 117 is formed, the first electrode 103 may be formed. In that case, as in the formation of the first electrode 103, the wiring 117 can be formed in such a manner that a conductive film is formed and an unnecessary portion thereof is removed. The planarization insulating film can be formed using an inorganic insulating material or an organic insulating material.

Note that a heat-resistant organic insulating material such as an acrylic resin, polyimide, a benzocyclobutene-based resin, polyamide, or an epoxy resin is preferably used for a planarization insulating film. Other than such organic insulating materials, it is possible to use a low-dielectric constant material (a low-k material), a siloxane-based resin, phosphosilicate glass (PSG), borophosphosilicate glass (BPSG), or the like. Note that the planarization insulating film may be formed by stacking a plurality of insulating films formed using these materials.

A method for forming the planarization insulating film is not particularly limited, and a sputtering method, a spin coating method, a dipping method, a printing method, an ink-jet method, or the like can be used depending on the material of the planarization insulating film.

Note that in the case where the dual-emission light-emitting element described in Embodiment 2 is manufactured, the auxiliary wiring in contact with the first electrode may be provided and the auxiliary wiring may be covered with the insulating layer at this stage. The auxiliary wiring can be formed by a method similar to the method used for forming the wiring 117 or another conductive film. The auxiliary wiring needs to be surely insulated from the second electrode by the insulating layer covering the auxiliary wiring; therefore, it is preferable that the auxiliary wiring have a shape which does not reduce coverage with the insulating layer.

Next, a second step of forming the insulating layer 111 over the first electrode 103 is performed. In the step of forming the insulating layer 111, first, an insulating film 104 is formed over the first electrode 103 (see FIG. 2B), and the insulating film 104 is processed into the island-shaped insulating layer 111 (see FIG. 2C). The insulating film 104 can be formed by an evaporation method, a sputtering method, a screen printing method, or the like. There is no particular limitation on the thickness of the insulating film 104 as long as insulation between the first electrode 103 and the auxiliary electrode 113 is ensured. The island-shaped insulating layer 111 is formed in such a manner that the insulating film 104 is processed by a photolithography method, a sputtering method, or the like. Note that etching or a photolithography process performed at this stage is conducted before the EL layer is formed, and thus, does not cause damage to the EL layer.

Figure 2D:
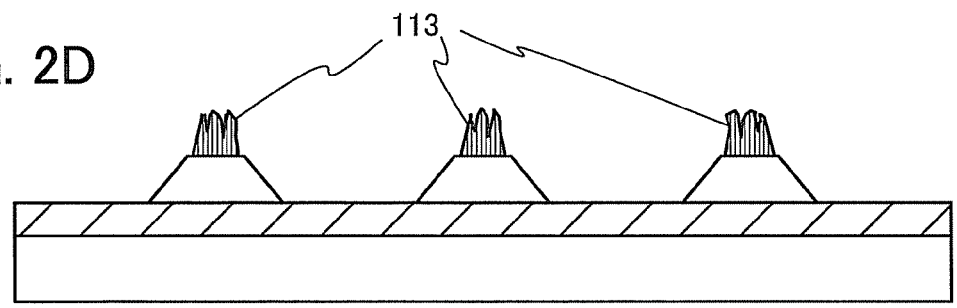

In the following third step, the auxiliary electrode 113 having the projection and the depression on the surface is provided over the insulating layer 111 (see FIG. 2D). The auxiliary electrode 113 can be formed by a method such as a screen printing method, a lithography method, a sputtering method, or an evaporation method. Since the auxiliary electrode 113 is formed before the EL layer is formed, the EL layer is not damaged whatever method is used for forming the auxiliary electrode 113.

In the case where an aluminum film is used for the auxiliary electrode, a hillock generated on the aluminum film by heat treatment may be used as a projection and a depression. The hillock formed on the aluminum film grows to a height of approximately 500 nm from the surface and the EL layer formed over the hillock does not cover the hillock in some cases. When growth of the hillock in a region where the auxiliary wiring is desirably formed is promoted and the hillock serves as the projection and the depression of the auxiliary electrode, the auxiliary wiring and the upper electrode can be easily electrically connected to each other.

Here, after the insulating layer 111 is formed, the auxiliary electrode 113 is formed by a screen printing method. In a screen printing method, a pattern is formed in such as manner that lattice openings called a silk or a mesh is fowled in a desired portion and a metal past is discharged through the lattice openings. Therefore, since the metal paste passing through the openings forms small particles and gathers, the auxiliary electrode formed by a screen printing method has the projection and the depression on the surface.

Further, by a screen printing method, the auxiliary electrode can be patterned without a photomask, so that cost of manufacturing a photomask can be reduced.

Figure 3A:
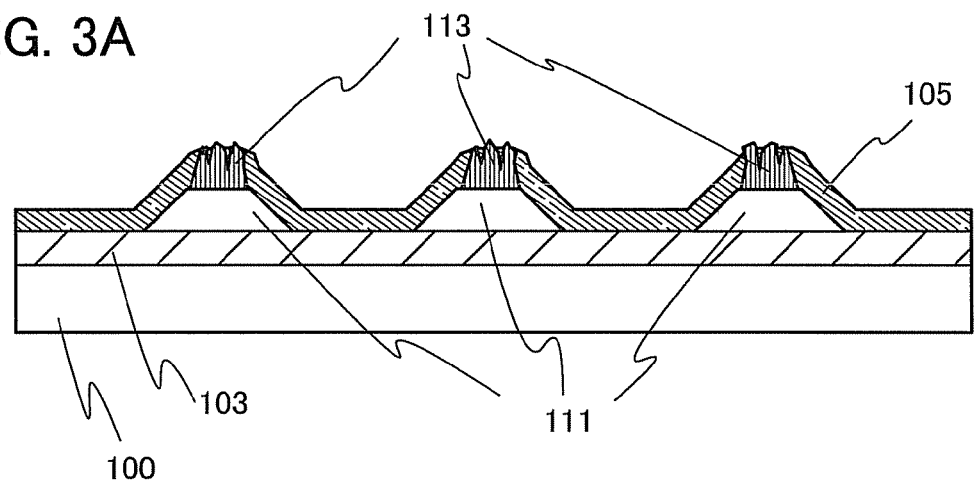
FIGS. 3A to 3C illustrate a method for manufacturing a light-emitting element according to an embodiment of the present invention.

Next, a fourth step of forming the EL layer 105 including at least a layer containing a light-emitting organic compound over the first electrode 103, the insulating layer 111, and the auxiliary electrode 113 is performed (see FIG. 3A). The EL layer 105 can be formed by a vacuum evaporation method or the like.

Figure 3B:
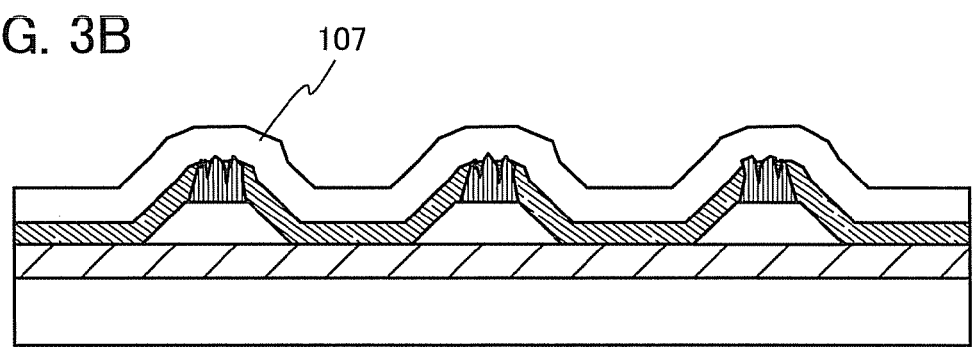
Figure 3C:
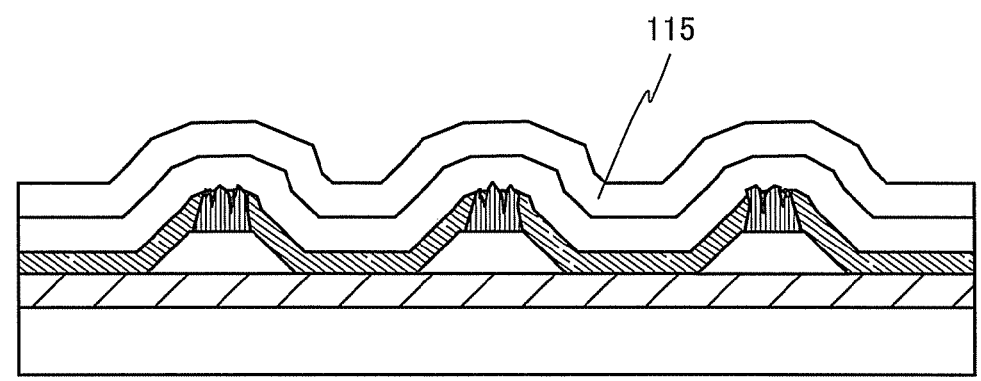

Next, a fifth step of forming the second electrode 107 over the EL layer 105 and the auxiliary electrode 113 is performed (see FIG. 3B). An evaporation method, a sputtering method, or the like can be used for forming the second electrode 107. It is preferable to form the EL layer 105 and the second electrode 107 successively, because an impurity or the like can be prevented from entering the EL layer 105 to cause damage thereto.

The EL layer 105 needs to be formed so that at least part of the projection of the auxiliary electrode 113 breaks through the EL layer 105. In general, the thickness of an EL layer is several hundreds of nanometers and the thickness of an auxiliary electrode is 5 μm to 15 μm. Since the EL layer is much thinner than the auxiliary electrode, when the EL layer is formed over the auxiliary electrode having the projection and the depression, the EL layer is disconnected, and thus, the auxiliary electrode 113 and the second electrode 107 are electrically connected to each other.

The second electrode 107 needs to be formed so that at least the projection portion of the auxiliary electrode 113 and the second electrode 107 are in contact with each other; thus, the connection between the auxiliary electrode 113 and the second electrode 107 can be ensured and a voltage drop of a specific portion of the second electrode 107 can be suppressed.

After that, a sealing film covering the second electrode 107 is formed. Here, the sealing film 115 is provided (see FIG. 3C). With the sealing film 115, entry of an impurity such as water from the outside can be suppressed, so that the light-emitting element can be highly reliable.

A planarization film may be provided over the sealing film 115. Alternatively, the sealing film 115 may have a function of a planarization film. A method for forming the sealing film and the planarization film is not particularly limited, and a sputtering method, a spin coating method, a dipping method, a printing method, an ink-jet method, a CVD method, or the like can be used depending on the material of the sealing film and the planarization film.

When the EL layer 105, the second electrode 107, and the sealing film 115 are successively formed, an impurity or the like does not enter the EL layer; thus, a highly reliable light-emitting element can be manufactured.

Through the above steps, a light-emitting element which includes an electrode for supporting conductivity of a second electrode (upper electrode) can be manufactured. Since the auxiliary electrode is provided for the second electrode having high resistivity, a light-emitting element in which a voltage drop of a specific portion of the second electrode is prevented and luminance unevenness is suppressed can be provided.

In the manufacturing method of this embodiment, an auxiliary electrode can be formed before formation of an EL layer; therefore, a step which might cause damage to the EL layer, such as a step of pushing a metal mask on the EL layer or a photolithography step, is not performed after the EL layer is formed. Thus, a highly reliable light-emitting element can be manufactured.

This embodiment can be combined with any of the other embodiments as appropriate.

Embodiment 4

In this embodiment, an example of an EL layer which can be applied to an embodiment of the present invention will be described with reference to FIGS. 9A to 9C. Since an EL layer is described in this embodiment, the island-shaped insulating layer, the auxiliary electrode, and the like are omitted.

Figure 9A:
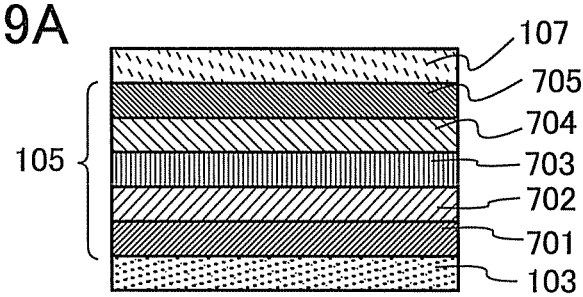
FIGS. 9A to 9C each illustrate an EL layer used for a light-emitting element according to an embodiment of the present invention.

As illustrated in FIG. 9A, the EL layer 105 is provided between the first electrode 103 and the second electrode 107. The first electrode 103 and the second electrode 107 can have structures similar to those in the above embodiments.

Although the first electrode 103 functions as an anode and the second electrode 107 functions as a cathode in the light-emitting element described in this embodiment, the present invention is not limited thereto. That is, the first electrode 103 may function as a cathode and the second electrode 107 may function as an anode.

The EL layer 105 includes at least a light-emitting layer containing a light-emitting organic compound. In addition, the EL layer 105 can have a layered structure in which a layer containing a substance having a high electron transport property, a layer containing a substance having a high hole transport property, a layer containing a substance having a high electron injection property, a layer containing a substance having a high hole injection property, a layer containing a bipolar substance (a substance having a high electron transport property and a high hole transport property), and the like are combined as appropriate. In this embodiment, a hole injection layer 701, a hole transport layer 702, a layer 703 containing a light-emitting organic compound, an electron transport layer 704, and an electron injection layer 705 are stacked in this order from the first electrode 103 side in the EL layer 105. Note that the stacking order may be inversed.

A method for manufacturing the light-emitting element illustrated in FIG. 9A will be described.

First, the first electrode 103 is formed. For the first electrode 103 functioning as an anode, any of metals, alloys, electrically conductive compounds, mixtures thereof, and the like which has a high work function (specifically, a work function of 4.0 eV or more) is preferably used. Specifically, gold, platinum, nickel, tungsten, chromium, molybdenum, iron, cobalt, copper, palladium, titanium, or the like can be used.

Note that, in the case where in the EL layer 105, a layer formed in contact with the first electrode 103 is formed using a composite material in which an organic compound and an electron acceptor (acceptor) which are described later are mixed, the first electrode 103 can be formed using any of various types of metals, alloys, electrically conductive compounds, mixtures thereof, and the like regardless of the work function. For example, aluminum, silver, an alloy containing aluminum, or the like can be used. The first electrode 103 can be formed by, for example, a sputtering method, an evaporation method (including a vacuum evaporation method), or the like.

The hole injection layer 701 is a layer containing a substance having a high hole injection property. As the substance having a high hole injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: $H_2Pc$) or copper(II) phthalocyanine (abbreviation: CuPc) may be used.

Further, any of the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N'-bis{4-[bis(3-methylphenyl)amino]phenyl}-N,N-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Still alternatively, any of high molecular compounds (e.g., oligomers, dendrimers, or polymers) may be used. Examples of the high-molecular compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-IPD). A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), may be used.

In particular, for the hole injection layer 701, a composite material in which an organic compound having a high hole transport property is mixed with an acceptor substance is preferably used. With the use of the composite material in which an organic compound having a high hole transport property is mixed with an acceptor substance, excellent hole injection from the first electrode 103 can be obtained, which results in a reduction in driving voltage of the light-emitting element. Such a composite material can be formed by co-evaporation of an organic compound having a high hole transport property and an acceptor substance. The hole injection layer 701 is formed using the composite material, whereby hole injection from the first electrode 103 to the EL layer 105 is facilitated.

As the organic compound for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole transport property. Specifically, a substance having a hole mobility of $10^{-6}$ cm$^2$/Vs or higher is preferably used. Note that any other substance may be used as long as the hole transport property thereof is higher than the electron transport property thereof. Specific examples of the organic compound that can be used for the composite material are given below.

Examples of the organic compound that can be used for the composite material include aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)phenyl]-10-phenylanthracene (abbreviation: CzPA), 9-[4-(9-phenylcarbazol-3-yl)]phenyl-10-phenylanthracene (abbreviation: PCzPA), and 1,4-bis[4-(N-carbazolyl)phenyl]-2,3,5,6-tetraphenylbenzene.

Further, any of the following aromatic hydrocarbon compounds may be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, and the like.

Furthermore, any of the following aromatic hydrocarbon compounds may be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Examples of the electron acceptor include organic compounds such as 7,7,8,8-tetracyano-2,3,5,6-tetrafluoroquinodimethane (abbreviation: $F_4$-TCNQ) and chloranil; and transition metal oxides. Other examples include oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron accepting property. Among these, molybdenum oxide is particularly preferable because it is stable in the air, has a low hygroscopic property, and is easily handled.

The composite material may be formed using the above electron acceptor and the above high molecular compound such as PVK, PVTPA, PTPDMA, or Poly-TPD and used for the hole injection layer 701.

The hole transport layer 702 is a layer containing a substance having a high hole transport property. As the substance having a high hole transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances given here are mainly ones that have a hole mobility of $10^{-6}$ cm$^2$/Vs or higher. Note that any other substance may be used as long as the hole transport property thereof is higher than the electron transport property thereof. Note that the layer containing a substance having a high hole transport property is not limited to a single layer and may be formed of a stack of two or more layers containing any of the above substances.

For the hole transport layer 702, a carbazole derivative such as CBP, CzPA, or PCzPA or an anthracene derivative such as t-BuDNA, DNA, or DPAnth may be used.

For the hole transport layer 702, a high molecular compound such as PVK, PVTPA, PTPDMA, or Poly-TPD may be used.

For the layer 703 containing a light-emitting organic compound, a fluorescent compound which exhibits fluorescence or a phosphorescent compound which exhibits phosphorescence can be used.

The fluorescent compounds that can be used for the layer 703 containing a light-emitting organic compound will be given. Examples of a material for blue light emission include N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA). Further, examples of a material for green light emission include 9,10-diphenyl-2-[N-phenyl-N-(9-phenyl-9H-carbazol-3-yl)amino]anthracene (abbreviation: 2PCAPA), 9,10-(biphenyl-2-yl)-2-[N-phenyl-N-(9-phenyl-9H-carbazol-3-yl)amino]anthracene (abbreviation: 2PCABPhA), 9,10-diphenyl-2-[N-(4-diphenylaminophenyl)-N-phenylamino]anthracene (abbreviation: 2DPAPA), 9,10-di(2-biphenylyl)-2-[N-(4-diphenylaminophenyl)-N-phenylamino]anthracene (abbreviation: 2DPABPhA), 9,10-di(2-biphenylyl)-2-{N-[4-(9H-carbazol-9-yl)phenyl]-N-phenylamino}anthracene (abbreviation: 2YGABPhA), and 9-(N,N-diphenylamino)-10-phenylanthracene (abbreviation: DPhAPhA). Examples of a material for yellow light emission include rubrene and 5,12-bis(1,1'-biphenyl-4-yl)-6,11-diphenyltetracene (abbreviation: BPT). Examples of a material for red light emission include N,N,N',N'-tetrakis(4-methylphenyl)tetracene-5,11-diamine (abbreviation: p-mPhTD), and 7,14-diphenyl-N,N,N',N'-tetrakis(4-methylphenyl)acenaphtho[1,2-a]fluoranthene-3,10-d iamine (abbreviation: p-mPhAFD).

The phosphorescent compounds that can be used for the layer 703 containing a light-emitting organic compound will be given. Examples of a material for blue light emission include bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ppy)$_2$(pic)), and bis[2-(4',6'-difluorophenyl)pyridinato-N,C$^{2'}$]iridium(III)acetylacetonate (abbreviation: FIr(acac)). Examples of a material for green light emission include tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$). Examples of a material for yellow light emission include bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis[2-(4-methoxyphenyl)-3,5-dimethylpyrazinato]iridium(III) (abbreviation: Ir(dmmoppr)$_2$(acac)). Examples of a material for orange light emission include tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)). Examples of a material for red light emission include organometallic complexes such as bis[2-(2'-benzo[4,5-a]thienyl)pyridinato-N,C$^{3'}$]iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), bis[2,3-bis(4-fluorophenyl)quinoxalinato]iridium(III)acetylacetonate (abbreviation: Ir(Fdpq)$_2$(acac)), (acetylacetonato)bis(2,3,5-triphenylpyrazinato)iridium(III) (abbreviation: Ir(tppr)$_2$(acac)), (acetylacetonato)bis(2,3,5-triphenylpyrazinato)iridium(III) (abbreviation: Ir(tppr)$_2$(dpm)), and (2,3,7,8,12,13,17,18-octaethyl-21H,23H-porphyrinato)platinum(II) (abbreviation: PtOEP). Further, rare-earth metal complexes, such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

Note that the layer 703 containing a light-emitting organic compound may have a structure in which the above light-emitting organic compound (a guest material) is dispersed in another substance (a host material). As a host material, a variety of kinds of materials can be used, and it is preferable to use a substance which has a lowest unoccupied molecular orbital level (LUMO level) higher than that of the light-emitting material and has a highest occupied molecular orbital level (HOMO level) lower than that of the light-emitting material.

Specific examples of the host material include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (abbreviation: BPhen), and bathocuproine (abbreviation: BCP); condensed aromatic compounds such as 9-[4-(N-carbazolyl)phenyl]-10-phenylanthracene (abbreviation: CzPA), 9-[4-(3,6-diphenyl-N-carbazolyl)phenyl]-10-phenylanthracene (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 9,10-diphenylanthracene (abbreviation: DPAnth), and 6,12-dimethoxy-5,11-diphenylchrysene; and aromatic amine compounds such as 9-{4-[3-(N,N-dipheylamino)-N-carbazolyl]phenyl}-10-phenylanthracene (abbreviation: CzA1PA), 4-(10-phenyl-9-anthryl)triphenylamine (abbreviation: DPhPA), 9-phenyl-10-(4-[N-phenyl-N-{3-(N-phenyl)carbazolyl}]amino)phenylanthracene (abbreviation: PCAPA), 9-(4-{4'-[N-phenyl-N—(N-phenyl-3-carbazolyl)]amino}phenyl)-10-phenylanthracene (abbreviation: PCAPBA), 9,10-diphenyl-2-[N-phenyl-N-(9-phenyl-9H-carbazol-3-yl)amino]anthracene (abbreviation: 2PCAPA), NPB (or α-NPD), TPD, DFLDPBi, and BSPB.

As the host material, plural kinds of materials can be used. For example, in order to suppress crystallization, a substance such as rubrene which suppresses crystallization may be further added. In addition, NPB, Alq, or the like may be further added in order to efficiently transfer energy to a guest material.

When a structure in which a guest material is dispersed in a host material is employed, crystallization of the layer 703 containing a light-emitting organic compound can be suppressed. Further, concentration quenching due to high concentration of the guest material can be suppressed.

For the layer 703 containing a light-emitting organic compound, a high molecular compound can be used. Specifically, a material for blue light emission, a material for green light emission, and a material for orange to red light emission are given. Examples of a material for blue light emission include poly(9,9-dioctylfluorene-2,7-diyl) (abbreviation: PFO), poly[(9,9-dioctylfluorene-2,7-diyl-co-(2,5-dimethoxybenzene-1,4-diyl)] (abbreviation: PF-DMOP), and poly{(9,9-dioctylfluorene-2,7-diyl)-co-[N,N'-di-(p-butylphenyl)-1,4-diaminobenzene]} (abbreviation: TAB-PFH). Examples of a material for green light emission include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), and poly[(9,9-dioctyl-2,7-divinylenfluorenylene)-alt-co-(2-methoxy-5-(2-ethylhexyloxy)-1,4-phenylene)]. Examples of a material for orange to red light emission include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, and poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD).

Further, by providing a plurality of layers each containing a light-emitting organic compound and making the emission colors of the layers different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that the word "complementary" means color relationship in which an achromatic color is obtained when colors are mixed. That is, when complementary colored light emitted from substances is mixed, white light emission can be obtained. This can be applied to a light-emitting element including three or more layers each containing a light-emitting organic compound.

The electron transport layer 704 is a layer containing a substance having a high electron transport property. As the substance having a high electron transport property, any of the following can be used, for example: a metal complex having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq2), or bis(2-methyl-8-quinolinolato)(4-phenylphenolato)aluminum(III) (abbreviation: BAlq). Alternatively, a metal complex or the like including an oxazole-based or thiazole-based ligand, such as bis[2-(2-benzoxazolyl)phenolato]zinc(II) (abbreviation: Zn(BOX)$_2$) or bis[2-(2-hydroxyphenyl)benzothiazolato]zinc (abbreviation: Zn(BTZ)$_2$), can be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like may be used. The substances mentioned here are mainly ones that have an electron mobility of $10^{-6}$ cm$^2$/Vs or higher. The electron transport layer is not necessarily a single layer and may be formed of a stack including two or more layers made of the aforementioned substance.

The electron injection layer 705 is a layer containing a substance having a high electron injection property. For the electron injection layer 705, an alkali metal, an alkaline earth metal, or a compound thereof, such as lithium, cesium, calcium, lithium fluoride, cesium fluoride, calcium fluoride, or lithium oxide, can be used. Further, a rare earth metal compound such as erbium fluoride may be used. Any of the above substances for forming the electron transport layer 704 can be used.

Note that the hole injection layer 701, the hole transport layer 702, the layer 703 containing a light-emitting organic compound, the electron transport layer 704, and the electron injection layer 705 which are described above can each be formed by an evaporation method (e.g., a vacuum evaporation method), an ink-jet method, a coating method, or the like.

Figure 9B:
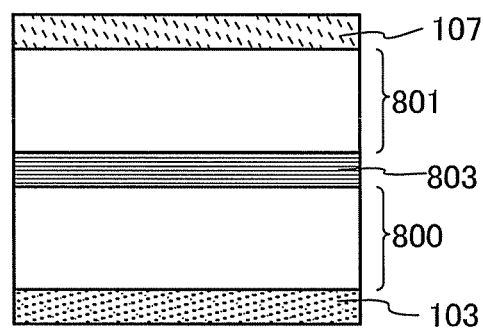

Note that a plurality of EL layers may be stacked between the first electrode 103 and the second electrode 107 as illustrated in FIG. 9B. In that case, a charge generation layer 803 is preferably provided between a first EL layer 800 and a second EL layer 801 which are stacked. The charge generation layer 803 can be formed by using the above-mentioned composite material. Further, the charge generation layer 803 may have a stacked structure including a layer containing the composite material and a layer containing another material. In that case, as the layer containing another material, a layer containing an electron donating substance and a substance having a high electron transport property, a layer formed of a transparent conductive film, or the like can be used. As for a light-emitting element having such a structure, problems such as energy transfer and quenching are less likely to occur, and thus a light-emitting element which has both high light luminous efficiency and long lifetime can be easily obtained due to expansion in the choice of materials. Moreover, a light-emitting element which provides phosphorescence from one of the EL layers and fluorescence from the other of the EL layers can be readily obtained. Note that this structure can be combined with the above-mentioned structures of the EL layer.

Further, by forming EL layers to emit light of different colors from each other, a light-emitting element as a whole can provide light emission of a desired color. For example, by forming a light-emitting element having two EL layers such that the emission color of the first EL layer and the emission color of the second EL layer are complementary colors, the light-emitting element can provide white light emission as a whole. Note that the word "complementary" means color relationship in which an achromatic color is obtained when colors are mixed. That is, when complementary colored light emitted from substances is mixed, white light emission can be obtained. This can be applied to a light-emitting element including three or more EL layers.

Figure 9C:
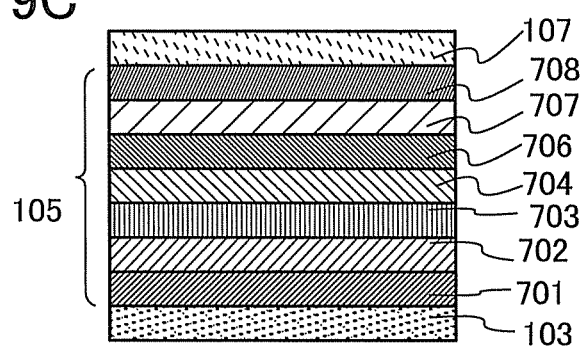

As illustrated in FIG. 9C, the EL layer 105 may include the hole injection layer 701, the hole transport layer 702, the layer 703 containing a light-emitting organic compound, the electron transport layer 704, an electron injection buffer layer 706, an electron relay layer 707, and a composite material layer 708 which is in contact with the second electrode 107, between the first electrode 103 and the second electrode 107.

It is preferable to provide the composite material layer 708 which is in contact with the second electrode 107 because damage caused to the EL layer 105 particularly when the second electrode 107 is formed by a sputtering method can be reduced. The composite material layer 708 can be formed using the above composite material in which an organic compound having a high hole transport property is mixed with an acceptor substance.

Further, by providing the electron injection buffer layer 706, an injection, barrier between the composite material layer 708 and the electron transport layer 704 can be reduced; thus, electrons generated in the composite material layer 708 can be easily injected to the electron transport layer 704.

Any of the following substances having a high electron injection property can be used for the electron injection buffer layer 706: an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), a rare earth metal compound (e.g., an oxide, a halide, and a carbonate)), and the like.

Further, in the case where the electron injection buffer layer 706 contains a substance having a high electron transport property and a donor substance, the donor substance is preferably added so that the mass ratio of the donor substance to the substance having a high electron transport property is from 0.001:1 to 0.1:1. Note that as the donor substance, an organic compound such as tetrathianaphthacene (abbreviation: TTN), nickelocene, or decamethylnickelocene may be used as well as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), and a rare earth metal compound (e.g., an oxide, a halide, and a carbonate)). Note that as the substance having a high electron transport property, a material similar to the material for the electron transport layer 704 described above can be used.

Furthermore, the electron relay layer 707 is preferably formed between the electron injection buffer layer 706 and the composite material layer 708. The electron relay layer 707 is not necessarily provided; however, by providing the electron relay layer 707 having a high electron transport property, electrons can be rapidly transported to the electron injection buffer layer 706.

The structure in which the electron relay layer 707 is sandwiched between the composite material layer 708 and the electron injection buffer layer 706 is a structure in which the acceptor substance contained in the composite material layer 708 and the donor substance contained in the electron injection buffer layer 706 are less likely to interact with each other, and thus their functions hardly interfere with each other. Accordingly, an increase in driving voltage can be prevented.

The electron relay layer 707 contains a substance having a high electron transport property and is formed so that the LUMO level of the substance having a high electron transport property is located between the LUMO level of the acceptor substance contained in the composite material layer 708 and the LUMO level of the substance having a high electron transport property contained in the electron transport layer 704. In the case where the electron relay layer 707 contains a donor substance, the donor level of the donor substance is controlled so as to be located between the LUMO level of the acceptor substance in the composite material layer 708 and the LUMO level of the substance having a high electron transport property contained in the electron transport layer 704. As a specific value of the energy level, the LUMO level of the substance having a high electron transport property contained in the electron relay layer 707 is preferably higher than or equal to −5.0 eV, more preferably higher than or equal to −5.0 eV and lower than or equal to −3.0 eV.

As the substance having a high electron transport property contained in the electron relay layer 707, a phthalocyanine-based material or a metal complex having a metal-oxygen bond and an aromatic ligand is preferably used.

As the phthalocyanine-based material contained in the electron relay layer 707, any of the following is preferably used: CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex which has a metal-oxygen double bond is stable. Thus, the use of the metal complex having a metal-oxygen double bond makes it possible to drive the light-emitting element at low voltage more stably.

As the metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based material described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron relay layer 707 may further contain a donor substance. Examples of the donor substance include organic compounds such as tetrathianaphthacene (abbreviation: TTN), nickelocene, and decamethylnickelocene, in addition to an alkali metal, an alkaline earth metal, a rare earth metal, and compounds of the above metals (e.g., alkali metal compounds (including an oxide such as lithium oxide, a halide, and carbonates such as lithium carbonate and cesium carbonate), alkaline earth metal compounds (e.g., an oxide, a halide, and a carbonate), and rare earth metal compounds (e.g., an oxide, a halide, and a carbonate)). When such a donor substance is contained in the electron relay layer 707, electrons can be transferred easily and the light-emitting element can be driven at lower voltage.

In the case where a donor substance is contained in the electron relay layer 707, other than the materials described above as the substance having a high electron transport property, a substance having a LUMO level higher than the acceptor level of the acceptor substance contained in the composite material layer 708 may be used. Specifically, it is preferable to use a substance having a LUMO level of higher than or equal to −5.0 eV, preferably higher than or equal to −5.0 eV and lower than or equal to −3.0 eV. As examples of such a substance, a perylene derivative and a nitrogen-containing condensed aromatic compound can be given. Note that a nitrogen-containing condensed aromatic compound is preferably used for the electron relay layer 707 because of its stability.

As specific examples of the perylene derivative, the following can be given: 3,4,9,10-perylenetetracarboxylicdianhydride (abbreviation: PTCDA), bisbenzimidazo[2,1-a:2',1'-a]anthra[2,1,9-def:6,5,10-d'e'f']diisoquinoline-10,21-dione (abbreviation: PTCBI), N,N'-dioctyl-3,4,9,10-perylenetetracarboxylic diimide (abbreviation: PTCDI-C8H), and N,N-dihexyl-3,4,9,10-perylenetetracarboxylic diimide (abbreviation: Hex PTC).

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), and 2,3-bis(4-fluorophenyl)pyrido[2,3-b]pyrazine (abbreviation: F2PYPR).

Other examples are 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: F$_{16}$CuPc), N,N-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''terthiophen (abbreviation: DCMT), and methanofullerene (e.g., [6,6]-phenyl C61 butyric acid methyl ester).

Note that in the case where a donor substance is contained in the electron relay layer 707, the electron relay layer 707 may be formed by a method such as co-evaporation of the substance having a high electron transport property and the donor substance.

The hole injection layer 701, the hole transport layer 702, the layer 703 containing a light-emitting organic compound, and the electron transport layer 704 may each be formed using any of the above materials.

Then, the second electrode 107 is formed over the EL layer 105.

For the second electrode 107 functioning as a cathode, any of metals, alloys, electrically conductive compounds, mixtures thereof, and the like which has a low work function (preferably, a work function of 3.8 eV or lower) is preferably used. Specific examples thereof are elements that belong to Groups 1 and 2 in the periodic table, that is, alkaline earth metals such as strontium, alloys thereof (e.g., Mg—Ag and Al—Li), rare earth metals such as europium and ytterbium, alloys thereof, aluminum, silver, and the like.

Note that, in the case where in the EL layer 105, a layer formed in contact with the second electrode 107 includes a composite material in which the organic compound and the electron donor (donor), which are described above, are mixed, a variety of conductive materials such as Al, Ag, ITO, and indium tin oxide containing silicon or silicon oxide can be used regardless of the work function.

Note that the second electrode 107 can be formed by a vacuum evaporation method or a sputtering method. Alternatively, in the case of using a silver paste or the like, a coating method, an ink-jet method, or the like can be used This embodiment can be combined with any of the other embodiments disclosed in this specification as appropriate.

Embodiment 5

In this embodiment, among light-emitting devices which includes light-emitting elements according to embodiments of the present invention, a light-emitting device which can be used mainly for a lighting device will be described with reference to FIGS. 10A and 10B. FIG. 10A is a top view of a light-emitting device 600 and FIG. 10B is a cross-sectional view taken along line A-B in FIG. 10A.

In the light-emitting device 600 illustrated in FIG. 10A, one electrode of a light-emitting element is electrically connected to a first terminal 603, and the other electrode of the light-emitting element is electrically connected to a second terminal 604.

The light-emitting device 600 having a top-emission structure, which is illustrated in FIG. 10B, includes, over the first substrate 601, a light-emitting element 608 including a first electrode 605, an insulating layer 610, an auxiliary wiring 611, an EL layer 606, and a second electrode 607. The light-emitting element 608 having a top-emission structure extracts light from the second substrate 602 side, which is opposite to the first substrate 601.

Since the auxiliary wiring 611 has a projection and a depression, the EL layer 606 is disconnected over the auxiliary wiring 611 and the auxiliary wiring 611 is electrically connected to the second electrode 607. The auxiliary wiring 611 is provided below the EL layer 606, so that a step which causes damage to the EL layer, such as etching or a lithography step, does not need to be performed after the EL layer 606 is formed. Thus, damage to the EL layer 606 can be reduced and a highly reliable light-emitting device can be provided.

Since the first electrode and the EL layer are insulated from each other by the insulating layer 610, a portion of the EL layer, in which light is blocked by the auxiliary wiring 611, does not emit light. Therefore, light which cannot be extracted to the outside is not emitted and a light-emitting device in which a reduction in energy efficiency is suppressed can be provided.

As illustrated in FIG. 10B, the first terminal 603 is electrically connected to the first electrode 605, and the second terminal 604 is electrically connected to the second electrode 607. Further, an insulating layer 609 is formed over an edge portion of the first electrode 605.

The first substrate 601 and the second substrate 602 are bonded to each other with a sealant 612. Further, a space between the first substrate 601 and the second substrate 602 is filled with a filler 613. The filler is provided for preventing light emitted from a light-emitting element from entering the air (atmosphere having a low refractive index) before entering the second substrate.

A gas barrier layer may be provided between the light-emitting element 608 and the filler 613. Provision of the gas barrier layer prevents impurities such as moisture from entering the light-emitting element. The filler 613 may contain a desiccant for removal of moisture that enters the light-emitting-element.

Note that although the light-emitting device 600 illustrated in FIG. 10A is octagonal, an embodiment of the present invention is not limited thereto. The light-emitting device 600 may have other polygonal shapes or a shape with a curve. In particular, as the shape of the light-emitting device 600, a triangular shape, a rectangular shape, a regular hexagonal shape, or the like is preferable. The reason for this is that the plurality of light-emitting devices 600 can be provided without a redundant space in a limited area.

Thus, a light-emitting device which is an embodiment of the present invention can be obtained. The light-emitting device of an embodiment of the present invention includes an auxiliary electrode having a projection and a depression below an EL layer; therefore, the EL layer is disconnected by the auxiliary electrode and the auxiliary electrode is electrically connected to a second electrode. Thus, a light-emitting device in which luminance unevenness due to a voltage drop caused by resistance of the second electrode is suppressed can be provided.

Further, the auxiliary wiring can be provided below the EL layer, so that damage to the EL layer in the manufacturing process can be reduced and a highly reliable light-emitting device can be provided. Moreover, a portion in which light is blocked by the auxiliary electrode does not emit light, whereby a light-emitting device in which a reduction in energy efficiency is suppressed can be provided.

Note that the structure described in this embodiment can be combined as appropriate with any of the structures described in the other embodiments.

Embodiment 6

In this embodiment, an example of a light-emitting device using the light-emitting device described in Embodiment 5 will be described with reference to FIG. 11.

Figure 11:
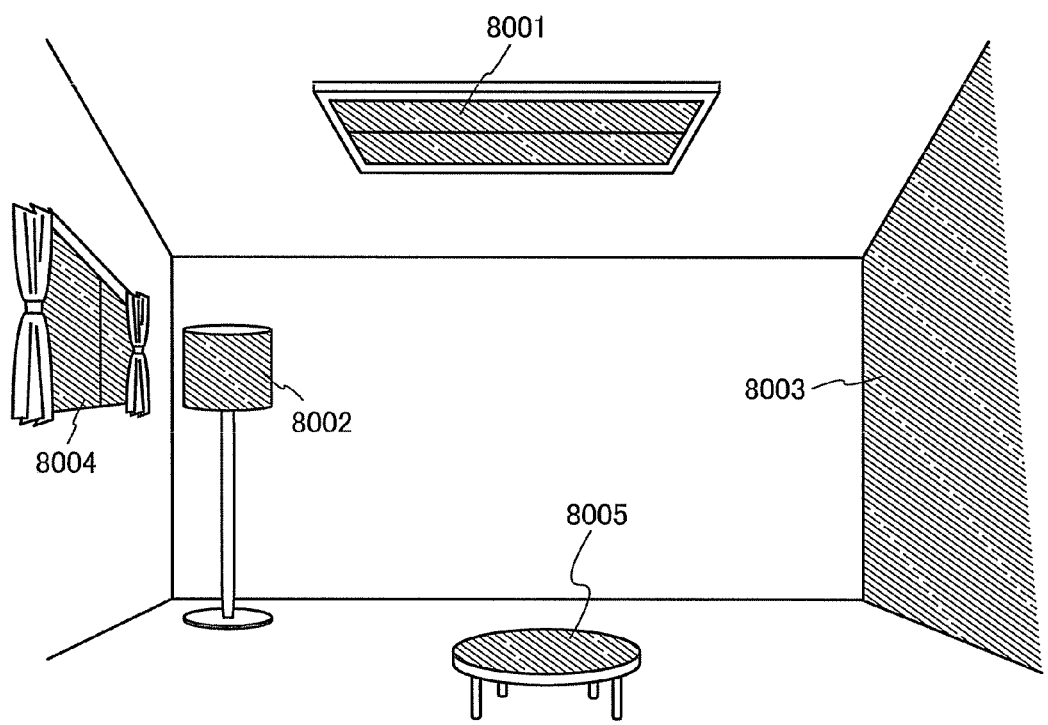
FIG. 11 illustrates light-emitting devices according to embodiments of the present invention.

FIG. 11 illustrates an example in which the light-emitting device which is an embodiment of the present invention is used as an indoor lighting device 8001. Note that since the area of the light-emitting device can be increased, a lighting device having a large area can also be formed. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Therefore, the lighting device can be elaborately designed in a variety of ways. Further, a wall of the room may be equipped with a large-sized lighting device 8003.

In addition, when being entirely formed using a light-transmitting material, a light-emitting device which is an embodiment of the present invention can be used as a window glass 8004.

Furthermore, a light-emitting device which is an embodiment of the present invention can be used as a table 8005 when the light-emitting device is used as a surface of the table. Note that a light-emitting device which is an embodiment of the present invention can be used as furniture when the light-emitting device is used as part of the furniture.

In this manner, a lighting device which is an embodiment of the present invention can be used for a variety of purposes. The light-emitting device described in this embodiment includes the light-emitting device which is an embodiment of the present invention and is described in the above embodiment, and thus is a highly reliable light-emitting device in which luminance unevenness is suppressed.

Note that the structure described in this embodiment can be combined as appropriate with any of the structures described in the other embodiments.

Example 1

In this example, the result of observation of a cross section of a sample in which an auxiliary electrode was formed by a screen printing method and then an EL layer and a second electrode were formed over the auxiliary electrode will be described.

First, an epoxy resin (S-30F B206 manufactured by TAIYO INK MFG. CO., LTD.) was printed over a glass substrate by a screen printing method and then baking was performed in an air atmosphere at 140° C. for 55 minutes; thus, an insulating layer was formed. Then, after a conductive paste containing silver particles (AGEP-201X manufactured by Sumitomo Electric Industries, Ltd.) was formed over the insulating layer by a screen printing method and backing was performed in an air atmosphere at 200° C. for 80 minutes; thus, an auxiliary electrode was formed.

After that, an EL layer with a thickness of approximately 300 was formed by a vacuum evaporation method.

Further, as a second electrode, an ITO film with a thickness of 110 nm was formed over the EL layer by a sputtering method. As a coat layer for performing observation of a cross section, a carbon layer was formed thereover.

After that, a region of the substrate including the auxiliary electrode was processed with a focused ion beam (FIB) system into a thin sample, and then, the cross section thereof was observed with the use of a scanning transmission electron microscope (STEM: "HD-2300" manufactured by Hitachi, Ltd.) at an acceleration voltage of 200 kV.

Figure 12A:
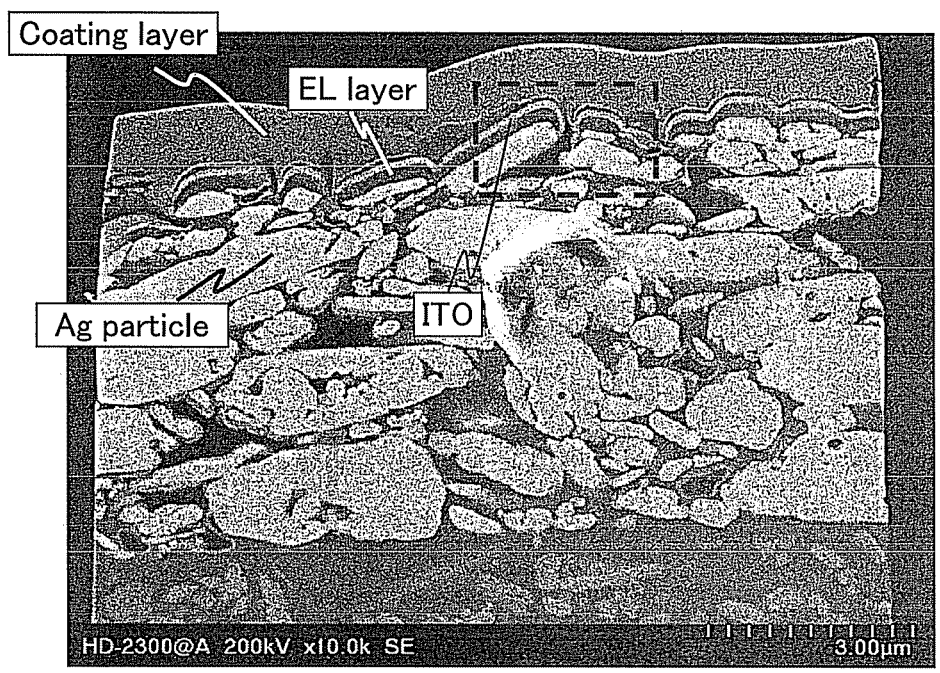
FIGS. 12A and 12B are each a cross-sectional photograph of a light-emitting element in Example 1.

FIG. 12A is a photograph of the cross-section at a magnification of 10000 times.

It was found that the auxiliary electrode was formed in such a manner that the silver particles having a variety of sizes gathered and that the surface of the auxiliary electrode was rough and included a projection and a depression.

In addition, it was found that the EL layer and the second electrode over the silver particles included a region with a small thickness or a region in which the film was disconnected, due to the projection and the depression of the surface of the auxiliary electrode.

Figure 12B:
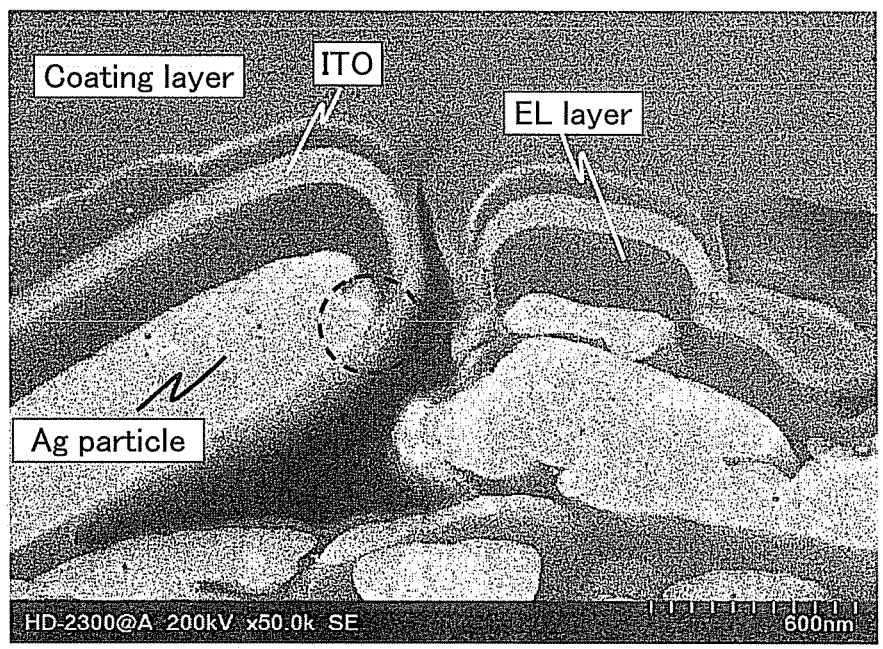

FIG. 12B is a photograph of the cross-section of a region surrounded by a dashed line in FIG. 12A at a magnification of 50000 times.

It was found from FIG. 12B that a region where part of the second electrode over the EL layer was in contact with the auxiliary electrode (the region indicated by a dashed line) was formed.

When attention is focused on the region surrounded by the dashed line in FIG. 12B, it was found that the EL layer was divided by the auxiliary electrode and the second electrode was connected to the auxiliary electrode beyond the EL layer.

Example 2

In this example, a lighting device was manufactured with the use of a light-emitting element according to an embodiment of the present invention and light emission of the lighting device was observed.

First, a method for manufacturing the lighting device in this example will be described.

A 50-nm-thick titanium film, a 200-nm-thick aluminum film, and a 100-nm-thick titanium film were stacked in this order by a sputtering method over a first glass substrate having a size of 270 mm×326.4 mm; thus, a first electrode was formed. In this example, the first electrode was used as an anode. Note that in consideration of power efficiency, a light-emitting region of the light-emitting element was divided into four parts in the longitudinal direction of the substrate.

Next, an epoxy resin (S-30F B206 manufactured by TAIYO INK MFG CO., LTD.) was printed in stripes each having a width of 400 μm over the first electrode by a screen printing method, and baking was performed in an air atmosphere at 140° C. for 30 minutes. Further, an epoxy resin was printed in stripes by a screen printing method again and baking was performed in an air atmosphere at 140° C. for 30 minutes. Thus, an insulating layer was formed. Note that the epoxy resin was printed twice for thickening the resin and ensuring insulation between the first electrode and an auxiliary electrode to be formed later. Per light-emitting region, 35 stripes of the insulating layers were formed.

Next, over the insulating layer, a conductive paste containing silver particles (AGEP-201X manufactured by Sumitomo Electric Industries, Ltd.) was formed by a screen printing method to have a width of 200 μm, and then, baking was performed in an air atmosphere at 200° C. for 80 minutes. Thus, an auxiliary electrode was formed.

Next, for covering an end portion of the first electrode, an insulating layer was formed using an epoxy resin (S-30F B206 manufactured by TAIYO INK MFG CO., LTD.) by a screen printing method and baking was performed twice in an air atmosphere at 140° C. for 30 minutes. Thus, an insulating layer covering the end portion of the first electrode layer was formed.

The insulating layer covering the end portion of the first electrode is an insulating layer for ensuring insulation between the first electrode and a second electrode to be formed later.

After that, an EL layer was formed to a thickness of approximately 300 nm by a vacuum evaporation method. The EL layer had a stacked structure including a layer emitting blue light and a layer emitting orange light.

Further, as the second electrode, an ITO film having a thickness of 110 nm was formed over the EL layer by a sputtering method. The lighting device of this example includes a top-emission light-emitting element in which light is extracted from a side opposite to a substrate provided with the light-emitting element. Therefore, ITO which has a light-transmitting property was used for the second electrode through which light was extracted.

Further, a second glass substrate having a size of 253.90 mm×314.40 mm was provided over the second electrode to perform sealing in order to prevent an impurity such as moisture from entering the light-emitting element.

Figure 13:
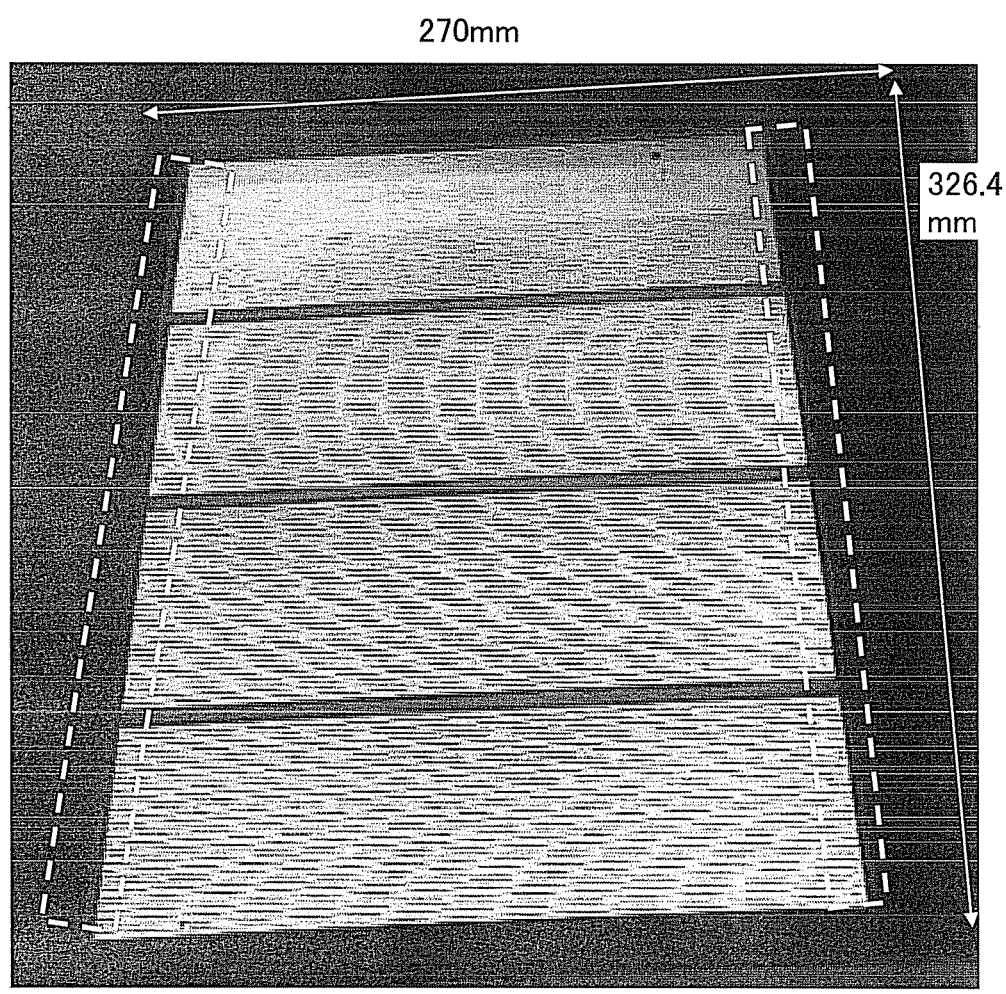
FIG. 13 is a photograph of a light-emitting device in Example 2.

FIG. 13 is a photograph at the time when the lighting device manufactured in this embodiment emits light. The auxiliary electrodes were formed along strip-shaped non-light-emitting regions in FIG. 13. In the lighting device of this example, regions where the auxiliary electrodes were formed do not emit light; therefore, power consumption can be reduced.

Electrodes for supplying current to the light-emitting regions are provided in regions indicated by dashed lines in the photograph. Current supplied from the right and left of the light-emitting regions is supplied uniformly over the whole light-emitting regions through the strip-shaped auxiliary electrodes. Accordingly, there is little difference between the light emission intensity at an end portion and that in a central portion and uniform light emission in which luminance unevenness is reduced can be obtained.

In the lighting device according to an embodiment of the present invention, the auxiliary electrode having the projection and the depression is provided on the element substrate side, so that the auxiliary electrode can be formed before the EL layer is formed, and a highly reliable light-emitting element in which damage to the EL layer in a manufacturing process is reduced is included. It was confirmed that the lighting device manufactured in this example exhibited uniform light emission, with the use of the highly reliable light-emitting element.

With an auxiliary electrode having a projection and a depression, the resistance of an upper electrode of a top-emission light-emitting element is reduced, and a voltage drop in the light-emitting element can be suppressed. Accordingly, in this example, the lighting device in which a voltage drop was suppressed in the light-emitting element and luminance unevenness was reduced was manufactured with the top-emission light-emitting device formed over the large-area substrate.

EXPLANATION OF REFERENCE

10: light-emitting element, 11: light-emitting element, 12: light-emitting element, 13: light-emitting element, 14: light-emitting element, 20: light-emitting element, 100: substrate, 103: first electrode, 104: insulating film, 105: EL layer, 107: second electrode, 109: partition, 111: insulating layer, 112: insulating layer, 113: auxiliary electrode, 115: sealing film, 117: wiring, 123: auxiliary electrode, 200: substrate, 203: first electrode, 205: EL layer, 207: second electrode, 209: auxiliary wiring, 211: insulating layer, 213: auxiliary electrode, 215: sealing film, 600: light-emitting device, 601: substrate, 602: substrate, 603: terminal, 604: terminal, 605: first electrode, 606: EL layer, 607: second electrode, 608: light-emitting element, 609: insulating layer, 610: insulating layer, 611: auxiliary wiring, 612: sealant, 613: filler, 701: hole-injection layer, 702: hole-transport layer, 703: layer containing light-emitting organic compound, 704: electron-transport layer, 705: electron-injection layer, 706: electron-injection buffer layer, 707: electron-relay layer, 708: composite material layer, 800: first EL layer, 801: second EL layer, 803: charge generation layer, 8001: lighting device, 8002: lighting device, 8003: lighting device, 8004: window glass, and 8005: table.

This application is based on Japanese Patent Application serial no. 2011-054822 filed with Japan Patent Office on Mar. 11, 2011, the entire contents of which are hereby incorporated by reference.

The invention claimed is:

1. A light-emitting element comprising:
   a first electrode;
   an insulating layer over the first electrode;
   an auxiliary electrode comprising a projection and a depression over the insulating layer;

a layer containing a light-emitting organic compound over the first electrode and the auxiliary electrode; and a second electrode over the layer containing the light-emitting organic compound and the auxiliary electrode, wherein the projection pierces the layer containing the light-emitting organic compound so that the auxiliary electrode is electrically connected to the second electrode, wherein the first electrode overlaps with the insulating layer and the auxiliary electrode, and wherein the first electrode is formed continuously under the insulating layer.

2. The light-emitting element according to claim 1,
wherein the first electrode reflects light emitted from the layer containing the light-emitting organic compound, and
wherein the second electrode transmits the light emitted from the layer containing the light-emitting organic compound.

3. The light-emitting element according to claim 1, further comprising an auxiliary wiring electrically connected to the first electrode between the first electrode and the insulating layer,
wherein the auxiliary wiring at least partially overlaps the auxiliary electrode, and
wherein the first electrode and the second electrode transmit light emitted from the layer containing the light-emitting organic compound.

4. The light-emitting element according to claim 1, further comprising a substrate under the first electrode.

5. The light-emitting element according to claim 1, wherein the projection has an inclination of greater than or equal to 40° and less than or equal to 140° with respect to the first electrode.

6. The light-emitting element according to claim 1, wherein a difference in height between the projection and the depression is greater than or equal to 0.5 µm and less than or equal to 10 µm.

7. The light-emitting element according to claim 1, wherein the auxiliary electrode comprises metal particles.

8. A light-emitting device comprising the light-emitting element according to claim 1.

9. A lighting device comprising the light-emitting element according to claim 1.

10. A light-emitting element comprising:
a first electrode;
an insulating layer over the first electrode;
an auxiliary electrode over the insulating layer, the auxiliary electrode formed by a process including a step of forming a layer using a conductive paste including metal particles over the insulating layer;

a layer containing a light-emitting organic compound over the first electrode and the auxiliary electrode; and a second electrode over the layer containing the light-emitting organic compound and the auxiliary electrode, wherein the auxiliary electrode passing through the layer containing the light-emitting organic compound is in contact with the second electrode, wherein the first electrode overlaps with the insulating layer and the auxiliary electrode, and wherein the first electrode is formed continuously under the insulating layer.

11. The light-emitting element according to claim 10,
wherein the first electrode reflects light emitted from the layer containing the light-emitting organic compound, and
wherein the second electrode transmits the light emitted from the layer containing the light-emitting organic compound.

12. The light-emitting element according to claim 10, further comprising an auxiliary wiring electrically connected to the first electrode between the first electrode and the insulating layer,
wherein the auxiliary wiring at least partially overlaps the auxiliary electrode, and
wherein the first electrode and the second electrode transmit light emitted from the layer containing the light-emitting organic compound.

13. The light-emitting element according to claim 10, wherein the first electrode and the second electrode transmit light emitted from the layer containing the light-emitting organic compound.

14. The light-emitting element according to claim 10, further comprising a substrate under the first electrode.

15. The light-emitting element according to claim 10,
wherein the auxiliary electrode comprises a projection and a depression formed of the metal particles, and
wherein the projection has an inclination of greater than or equal to 40° and less than or equal to 140° with respect to the first electrode.

16. The light-emitting element according to claim 10,
wherein the auxiliary electrode comprises a projection and a depression formed of the metal particles, and
wherein a difference in height between the projection and the depression is greater than or equal to 0.5 µm and less than or equal to 10 µm.

17. A light-emitting device comprising the light-emitting element according to claim 10.

18. A lighting device comprising the light-emitting element according to claim 10.

* * * * *

UNITED STATES PATENT AND TRADEMARK OFFICE
CERTIFICATE OF CORRECTION

| | | |
|---|---|---|
| PATENT NO. | : 8,659,011 B2 | Page 1 of 1 |
| APPLICATION NO. | : 13/415450 | |
| DATED | : February 25, 2014 | |
| INVENTOR(S) | : Kohei Yokoyama and Hisao Ikeda | |

It is certified that error appears in the above-identified patent and that said Letters Patent is hereby corrected as shown below:

In the Specification:

Column 3, line 43; Change "fight-transmitting" to --light-transmitting--.

Column 3, line 44; Change "for, the" to --for the--.

Column 5, line 26; Change "the terra" to --the term--.

Column 6, line 66; Change "is fainted " to --is formed--.

Column 7, line 23; Change "angle limited" to --angle formed--.

Column 8, line 51; Change "resin, cycloolefin" to --resin, a cycloolefin--.

Column 15, line 20; Change "is fowled in" to --is formed in--.

Column 17, line 10; Change "pounds; mixtures" to --pounds, mixtures--.

Column 17, line 33; Change "-N,N-diphenyl-(" to -- -N,N'-diphenyl-(--.

Column 17, line 46; Change "poly[N-(4-[N-[4-(" to --poly[N-(4-(N'-[4-(--.

Column 17, line 49; Change "Poly-IPD)." to --Poly-TPD).--.

Column 18, line 20; Change "N,N" to --N,N'--.

Column 19, line 29; Change "N,N-diphenylstil-" to --N,N'-diphenylstil- --.

Column 19, line 29; Change "]-N,N-diphenylstil- --." to --]-N,N'-diphenylstil- --.

Column 23, line 37; Change "injection, barrier" to --injection barrier--.

Column 25, line 39; Change "and N,N-" to --and N,N'- --.

Column 25, line 53; Change "N,N-bis(" to --N,N'-bis(--.

Column 28, line 37; Change "300 was" to --300 nm was--.

Column 29, line 21; Change "MFG CO., LTD.)" to --MFG. CO., LTD.)...--.

Column 29, line 40; Change "MFG CO., LTD.)" to --MFG. CO., LTD.)...--.

Signed and Sealed this
Twenty-ninth Day of July, 2014

Michelle K. Lee
*Deputy Director of the United States Patent and Trademark Office*